(12) United States Patent
Larson, III et al.

(10) Patent No.: US 7,362,198 B2
(45) Date of Patent: *Apr. 22, 2008

(54) PASS BANDWIDTH CONTROL IN DECOUPLED STACKED BULK ACOUSTIC RESONATOR DEVICES

(75) Inventors: John D. Larson, III, Palo Alto, CA (US); Stephen L. Ellis, Pleasanton, CA (US)

(73) Assignee: Avago Technologies Wireless IP (Singapore) Pte. Ltd, Singapore (SG)

( * ) Notice: Subject to any disclaimer, the term of this patent is extended or adjusted under 35 U.S.C. 154(b) by 104 days.

This patent is subject to a terminal disclaimer.

(21) Appl. No.: 10/965,449

(22) Filed: Oct. 13, 2004

(65) Prior Publication Data

US 2005/0093658 A1   May 5, 2005

Related U.S. Application Data

(63) Continuation-in-part of application No. 10/699,289, filed on Oct. 30, 2003, now Pat. No. 7,019,605, and a continuation-in-part of application No. 10/699,481, filed on Oct. 30, 2003, now Pat. No. 6,946,928.

(51) Int. Cl.
*H03H 9/54* (2006.01)

(52) U.S. Cl. ............. 333/187; 333/189; 333/192; 310/322; 310/334

(58) Field of Classification Search ........ 333/187–189, 333/133

See application file for complete search history.

(56) References Cited

U.S. PATENT DOCUMENTS 3,174,122 A   3/1965   Fowler et al.
3,189,851 A   6/1965   Fowler
3,321,648 A   5/1967   Kolm
3,422,371 A   1/1969   Poirier et al.
3,568,108 A   3/1971   Poirier et al.
3,582,839 A   6/1971   Pim et al.
3,590,287 A   6/1971   Berlincourt et al.

(Continued)

FOREIGN PATENT DOCUMENTS

DE   101 60 617 A1 *   6/2003

(Continued)

OTHER PUBLICATIONS

Lakin, K.M., "Bulk Acoustic Wave Coupled Resonator Filters", 2002 IEEE Intl. Frequency Control Symposium and PDA Exhibition, pp. 8-14, May 29-31, 2002.

(Continued)

*Primary Examiner*—Barbara Summons

(57) ABSTRACT

The decoupled stacked bulk acoustic resonator (DSBAR) device has a lower film bulk acoustic resonator (FBAR), an upper FBAR stacked on the lower FBAR, and an acoustic decoupler between the FBARs. Each of the FBARs has opposed planar electrodes and a layer of piezoelectric material between the electrodes. The acoustic decoupler has acoustic decoupling layers of acoustic decoupling materials having different acoustic impedances. The acoustic impedances and thicknesses of the acoustic decoupling layers determine the acoustic impedance of the acoustic decoupler, and, hence, the pass bandwidth of the DSBAR device. Process-compatible acoustic decoupling materials can then be used to make acoustic decouplers with acoustic impedances (and pass bandwidths) that are not otherwise obtainable due to the lack of process-compatible acoustic decoupling materials with such acoustic impedances.

11 Claims, 14 Drawing Sheets

U.S. PATENT DOCUMENTS

| | | | |
|---|---|---|---|
| 3,610,969 A | 10/1971 | Clawson et al. | |
| 3,826,931 A | 7/1974 | Hammond | |
| 3,845,402 A | 10/1974 | Nupp | |
| 4,084,217 A | 4/1978 | Brandlis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | 29/25.35 |
| 5,910,756 A | 6/1999 | Ella | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa et al. | |
| 6,060,818 A | 5/2000 | Ruby et al. | |
| 6,087,198 A | 7/2000 | Panasik | |
| 6,107,721 A | 8/2000 | Lakin | 310/321 |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | 333/133 |
| 6,265,246 B1 | 7/2001 | Ruby et al. | |
| 6,278,342 B1 * | 8/2001 | Ella | 333/189 |
| 6,292,336 B1 | 9/2001 | Horng et al. | |
| 6,307,447 B1 | 10/2001 | Barber et al. | |
| 6,307,761 B1 | 10/2001 | Nakagawa | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | 333/187 |
| 6,466,418 B1 | 10/2002 | Horng et al. | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ellaet et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 * | 4/2004 | Lakin | 333/189 |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta et al. | |
| 6,874,211 B2 | 4/2005 | Bradley et al. | |
| 6,874,212 B2 | 4/2005 | Larson, III | |
| 6,888,424 B2 | 5/2005 | Takeuchi et al. | |
| 6,900,705 B2 | 5/2005 | Nakamura et al. | |
| 6,903,452 B2 | 6/2005 | Ma et al. | |
| 6,906,451 B2 | 6/2005 | Yamada et al. | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 * | 9/2005 | Larson et al. | 333/189 |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |

| | | |
|---|---|---|
| 6,985,052 B2 | 1/2006 | Tikka |
| 6,987,433 B2 | 1/2006 | Larson, III et al. |
| 6,989,723 B2 | 1/2006 | Komuro et al. |
| 7,019,604 B2 | 3/2006 | Gotoh et al. |
| 7,019,605 B2 | 3/2006 | Larson et al. |
| 7,057,476 B2 | 6/2006 | Hwu |
| 7,091,649 B2 | 8/2006 | Larson et al. |
| 7,098,758 B2 | 8/2006 | Wang et al. |
| 6,635,509 B1 | 1/2007 | Ouellet |
| 6,998,940 B2 | 1/2007 | Metzger |
| 7,170,215 B2 | 1/2007 | Namba et al. |
| 7,187,254 B2 | 3/2007 | Su et al. |
| 2002/0000646 A1 | 1/2002 | Gooch et al. |
| 2002/0030424 A1 | 3/2002 | Iwata |
| 2002/0121944 A1 | 9/2002 | Larson et al. |
| 2002/0121945 A1 | 9/2002 | Ruby et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. ........... 333/133 |
| 2003/0132493 A1 | 7/2003 | Kang et al. |
| 2003/0141946 A1 | 7/2003 | Ruby et al. |
| 2003/0179053 A1 | 9/2003 | Aigner et al. |
| 2004/0092234 A1 | 5/2004 | Pohjonen |
| 2004/0124952 A1 | 7/2004 | Tikka |
| 2004/0150293 A1* | 8/2004 | Unterberger ........... 310/322 |
| 2004/0150296 A1 | 8/2004 | Park et al. |
| 2004/0195937 A1 | 10/2004 | Matsubara et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1* | 3/2005 | Stoemmer ........... 333/189 |
| 2005/0093396 A1 | 5/2005 | Larson et al. |
| 2005/0093653 A1 | 5/2005 | Larson, III |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson et al. |
| 2005/0110598 A1 | 5/2005 | Larson, III |
| 2005/0128030 A1 | 6/2005 | Larson et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0218488 A1 | 10/2005 | Mie |
| 2006/0087199 A1 | 4/2006 | Larson et al. |
| 2006/0103492 A1 | 5/2006 | Feng et al. |
| 2006/0132262 A1 | 6/2006 | Fazzio et al. |
| 2006/0164183 A1 | 7/2006 | Tikka |
| 2006/0185139 A1 | 8/2006 | Larson, III et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |

FOREIGN PATENT DOCUMENTS

| | | |
|---|---|---|
| EP | 0865157 | 9/1998 |
| EP | 0 880 227 | 11/1998 |
| EP | 0973256 | 1/2000 |
| EP | 1 047 189 | 10/2000 |
| EP | 1 100 196 | 5/2001 |
| EP | 1096259 | 5/2001 |
| EP | 1258990 | 11/2002 |
| EP | 1180494 | 3/2003 |
| EP | 1 542 362 | 6/2003 |
| EP | 1258990 | 1/2004 |
| EP | 1 517 444 | 3/2005 |
| EP | 1249932 | 3/2005 |
| EP | 1517443 | 3/2005 |
| EP | 1528674 | 5/2005 |
| EP | 1528675 | 5/2005 |
| EP | 1528677 | 5/2005 |
| EP | 1 557 945 | 7/2005 |
| EP | 1575165 | 9/2005 |
| GB | 1207974 | 10/1970 |
| GB | 2411239 | 8/2005 |
| GB | 2418791 | 4/2006 |
| JP | 2002-217676 | 8/2002 |
| WO | WO 98/16957 | 4/1998 |
| WO | WO-01/06647 | 1/2001 |
| WO | WO-01/99276 | 12/2001 |
| WO | WO-02/103900 | 12/2002 |
| WO | WO 03/030358 | 4/2003 |
| WO | WO-03/043188 | 5/2003 |
| WO | WO 03/050950 | 6/2003 |
| WO | WO 03/058809 | 7/2003 |
| WO | WO 2003/005880 | 7/2003 |
| WO | WO 2004/034579 | 4/2004 |
| WO | WO-2004/051744 | 6/2004 |
| WO | WO-2005/043752 | 5/2005 |
| WO | WO-2005/043753 | 5/2005 |
| WO | WO-2005/043756 | 5/2005 |

OTHER PUBLICATIONS

Examination Report from the U.K. for application GB0605971.31, dated Aug. 24, 2006.
Yang, C.-M., Highly C-Axis-Oriented AIN Film Using MOCVD for 5GHz-Band FBAR Filter, IEEE Ultrasonics Symposium, Oct. 5, 2003, 99, 170-173.
Examination Report corresponding to application No. GB0605775.6 dated Aug. 30, 2006.
Examination Report corresponding to application No. GB0605770.7 dated Aug. 25, 2006.
B. Hadimioglu et al., "Polymer Films As Acoustic Matching Layers", 1990 IEEE Ultrasonics Sysmposium Proceedings, vol. 3 pp. 1337-1340, Dec. 1990.
Jung, Jun-Phil, "Experimental and Theoretical INvestigation on the Relationship between AIN Properties and AIN-based FBAR Characteristics", IEEE Internations Frequency Control Symposium, May 4, 2003, pp. 779-784.
Krishnaswamy, S.V., et al., "Film Bulk Acoustic Wave Resonatior Technology", Ultrasonic Symposium, 1990, pp. 529-535.
Lobl, H.P., et al., "Piezoelectric Material for BAW Resonators and Filters", IEEE Ultrasonics Symposium Oct. 5, 2003, pp. 807-811.
Martin, et al., "Development of Low-Dielectric Constant Polymer for Fabrication of Integrated Circuit Interconnect", 12 Advanced Materials, pp. 1769-1778, No. 23 Dec. 1, 2000.
Reinhardt, Alexandre et al., "Design of Coupled Resonator Filters Using Admittance and Scattering Matrices", 2003 IEEE Ultrasonics Symposium, Oct. 5, 2003, pp. 1428-1431.
Holzlohner, Ronald et al., "Accurate Calculation of Eye Diagrams and Bit Error Rates in Optical Transmission Systems Using Linearization", *Journal of Lightwave Technology, vol. 20, No. 3.*, (Mar. 2002), pp. 389-400.
Reinhartd, Alexandre et al., "Design of Coupled Resonator Filters Using Admittance and Scattering Matrices", *2003 IEEE Ultrasonics Symposium*, (May 3, 2003), 1428-1431.
Lakin, K.M. "Coupled Resonator Filters", *2002 IEEE Ultrasonics Symposium*, (Mar. 2, 2002), 901-908.

Lakin, K.M. et al., "High Performance Stacked Crystal Filters for GPS and Wide Bandwidth Applications", *2001 IEEE Ultrasonics Symposium*, (Jan. 1, 2001), 833-838.

"Search Report from corresponding application number", *GB 0605779.8*, (Aug. 23, 2006).

Hadimioglu, B. et al., "Polymer Films As Acoustic Matching Layers", *1990 IEEE Ultrasonics Symposium Proceedings, vol. 3 PP.*, Previously submitted as Polymer Files As Acoustic Matching Layers, 1990 IEEE Ultrasonics Symposium Proceeding. vol. 4 pp. 1227-1340, Dec. 1990. Considered by Examiner on Mar. 20, 2007,(Dec. 1990),1337-1340.

U.S. Appl. No. 10/971,169, filed Oct. 22, 2004, inventor Larson, III et al.

"Search report from corresponding application No.", *GB0620152.9*, (Nov. 15, 2006).

"Search report from corresponding application No.", *GB0620655.1*, (Nov. 17, 2006).

"Search report from corresponding application No.", *GB0620653.6*, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995), pp. 5.1 to 5.29.

"A partial copy of GB Search Report for", *Application No. GB0522393.8*, (Jan. 9, 2006), 4 pages.

"A partial copy of GB Search Report for Application No.", *GB0525884.3*, (Feb. 2, 2006), 4 pgs.

Auld, B. A., "Acoustic Resonators", *Acoustic Fields and Waves in Solids, Second Edition, vol. II*, (1990), 250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys. 54 (10)*, (Oct. 1983), 5893-5910.

"Search Report from corresponding application", *No. GB0605225.2*, (Jun. 26, 2006).

"Search Report for Great Britain Patent Application", *No. 0617742.2*, (Mar. 29, 2007).

"Search Report for Great Britain Patent Application", *No. 0617742.2*, (Dec. 13, 2006).

"Search Report in the Great Britain Patent Application", *No. 0619698.4*, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005), 217-221.

Schuessler, Hans H., "Ceramic Filters and Resonators", *Reprinted from IEEE Trans. Sonics Ultrason., vol. SU-21*, (Oct. 1974), 257-268.

Fattinger, G. G., et al., "Coupled Bulk Acoustic Wave Resonator Filters: Key technology for single-to-balanced RF filters", *0-7803-8331-1/4W20.00; IEEE MTT-S Digest*, (2004), 927-929.

Choi, Sungjin et al., "Design of Half-Bridge Piezo-Transformer Converters in the AC Adapter Applications", *IEEE 2005*, 244-248.

Li, Yunxiu et al., "AC -DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics, vol. 19, No. 6.*, (Nov. 2004).

Navas, J. et al., "Miniaturised Battery Charger using Piezoelectric Transformers", *IEEE*, (2001), 492-496.

Jiang, Yimin et al., "A Novel Single-Phase Power Factor Correction Scheme", *IEEE*, (1993),287-292.

\* cited by examiner

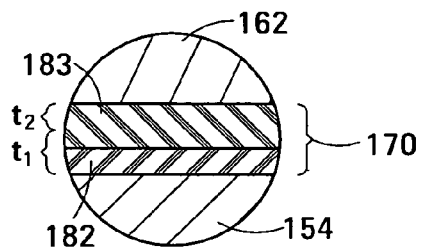 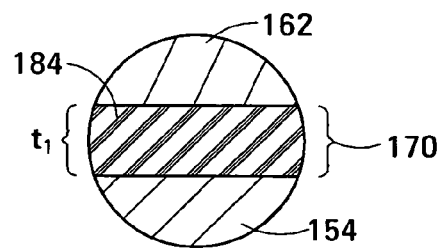
FIG. 3D　　　　　　　FIG. 3E
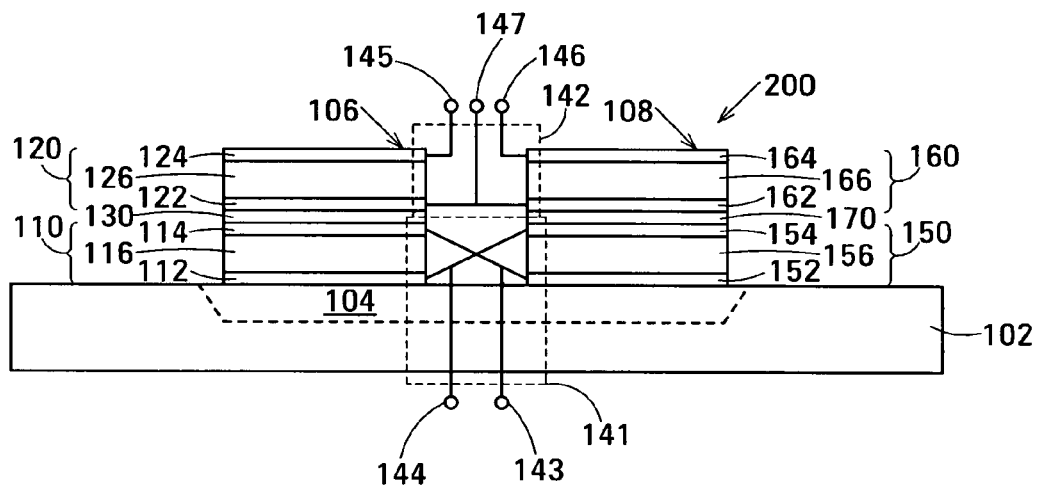
FIG. 3F
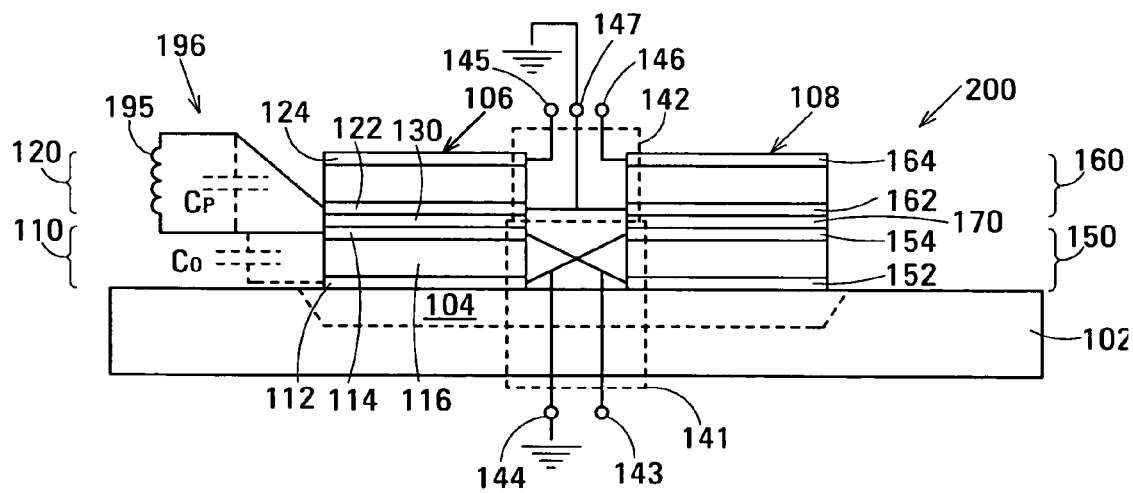
FIG. 3G

PASS BANDWIDTH CONTROL IN DECOUPLED STACKED BULK ACOUSTIC RESONATOR DEVICES

RELATED APPLICATIONS

This application is a Continuation-in-Part of U.S. patent application Ser. No. 10/699,289, filed on Oct. 30, 2003 now U.S. Pat. No. 7,019,605, of John D. Larson III entitled Decoupled Stacked Bulk Acoustic Resonator Band-Pass Filter with Controllable Pass Bandwidth and of U.S. patent application Ser. No. 10/699,481, filed on Oct. 30, 2003 now U.S. Pat. No. 6,946,928, of John D. Larson III and Richard Ruby entitled Thin-Film Acoustically-Coupled Transformer. This application is also related to U.S. patent application Ser. No. 10/965,586 of John D. Larson III and Richard Ruby entitled Film Acoustically-Coupled Transformer With Increased Common Mode Rejection, U.S. patent application Ser. No. 10/965,541 of John D. Larson III and Stephen Ellis entitled Decoupled Stacked Bulk Acoustic Resonator Band-Pass Filter with Controllable Pass Bandwidth, and U.S. patent application Ser. No. 10/965,637 of John D. Larson III, Richard Ruby and Stephen Ellis entitled Film Acoustically-Coupled Transformer, all filed on the filing date of this application. The above applications are all assigned to the assignee of this application and the disclosures of the above applications are incorporated into this application by reference.

BACKGROUND

Electrical band-pass filters are used in many different types of consumer and industrial electronic product to select or reject electrical signals in a range of frequencies. In recent years, the physical size of such products has tended to decrease significantly while the circuit complexity of the products has tended to increase. U.S. patent application Ser. No. 10/699,298 of John D. Larson III entitled Stacked Bulk Acoustic Resonator Band-Pass Filter with Controllable Pass Bandwidth, of which this application is a continuation-in-part, discloses a highly miniaturized, high-performance, low-cost band-pass filter based on a decoupled stacked bulk acoustic resonator (DSBAR). A DSBAR is composed of stacked film bulk acoustic resonators (FBARs) and an acoustic decoupler located between the FBARs.

Transformers are used in many types of electronic device to perform such functions as transforming impedances, linking single-ended circuitry with balanced circuitry or vice versa and providing electrical isolation. However, not all transformers have all of these properties. For example, an auto-transformer does not provide electrical isolation. U.S. patent application Ser. No. 10/699,481 of John D. Larson III and Richard Ruby entitled Thin-Film Acoustically-Coupled Transformer, of which this disclosure is a continuation-in-part, discloses a highly miniaturized, high-performance, low-cost transformer that has one or more DSBARs each incorporating an acoustic decoupler. This film acoustically-coupled transformer (FACT) is capable of providing one or more of the following attributes at electrical frequencies in the range from UHF to microwave: impedance transformation, coupling between balanced and unbalanced circuits and electrical isolation. A FACT typically additionally has a low insertion loss, a bandwidth sufficient to accommodate the frequency range of cellular telephone RF signals, for example, a size smaller than transformers currently used in cellular telephones and a low manufacturing cost.

The above-described band-pass filter and FACT and other devices that incorporate one or more DSBARs, each incorporating an acoustic decoupler located between its constituent FBARs, will be referred to in this disclosure as decoupled stacked film bulk resonator devices or, more concisely, as DSBAR devices.

As disclosed in the above-mentioned U.S. patent applications Ser. Nos. 10/669,289 and 10/669,481 (the parent applications), DSBAR devices have a band pass characteristic having a pass bandwidth determined by the properties of the acoustic decoupler. In embodiments of the DSBAR devices disclosed the parent applications, the acoustic decoupler was embodied as a single acoustic decoupling layer. The acoustic decoupling layer of each DSBAR is a layer of an acoustic decoupling material having an acoustic impedance different from the acoustic impedances of the materials of the FBARs that constitute the DSBAR. The acoustic impedance of an acoustic decoupling material is the ratio of stress to particle velocity in the material and is measured in Rayleighs, abbreviated as rayl.

In practical embodiments, the acoustic decoupling material was a plastic material having an acoustic impedance less than the acoustic impedances of the materials of the FBARs. A typical plastic acoustic decoupling material has an acoustic impedance of less than ten whereas the materials of the FBARs have acoustic impedances of greater than 30. The pass bandwidth of such embodiments depends on the acoustic impedance of the acoustic decoupling material. Accordingly, the pass bandwidth of an DSBAR device would appear to be definable simply by selecting an acoustic decoupling material having the appropriate acoustic impedance.

In practice, it has proven difficult to define the pass bandwidth of an DSBAR device simply by choosing an appropriate acoustic decoupling material. Materials that have acoustic impedances in the range that produces the most typically-used pass bandwidths with typical FBAR materials and that additionally have the ability to withstand the high temperatures and the etchants used in the processing performed after the acoustic decoupling layer has been formed are actually few in number.

What is needed, therefore, is an alternative way of defining the pass bandwidth of an DSBAR device.

SUMMARY OF THE INVENTION

The invention provides in one aspect a decoupled stacked bulk acoustic resonator (DSBAR) device that comprises a lower film bulk acoustic resonator (FBAR), an upper FBAR stacked on the lower FBAR, and an acoustic decoupler between the FBARs. Each FBAR comprises opposed planar electrodes and a piezoelectric element between the electrodes. The acoustic decoupler comprises acoustic decoupling layers of acoustic decoupling materials having different acoustic impedances. The acoustic impedances and thicknesses of the acoustic decoupling layers determine the acoustic impedance of the acoustic decoupler, and, hence, the pass bandwidth of the DSBAR device. Process-compatible acoustic decoupling materials can be used to make acoustic decouplers with acoustic impedances (resulting in pass bandwidths) that are not otherwise obtainable due to the lack of process-compatible acoustic decoupling materials with the such acoustic impedances.

In an embodiment, the DSBAR device is a film acoustically-coupled transformer (FACT) and additionally comprises an additional lower FBAR, an additional upper FBAR stacked on the additional lower FBAR, and an additional acoustic decoupler between the additional FBARs. Each additional FBAR comprises opposed planar electrodes and a piezoelectric element between the electrodes. The additional acoustic decoupler comprises acoustic decoupling layers of acoustic decoupling materials having different acoustic impedances. The FACT additionally comprises a first electrical circuit interconnecting the lower FBARs; and a second electrical circuit interconnecting the upper FBARs.

In another aspect, the invention provides a DSBAR device that comprises lower film bulk acoustic resonator (FBAR), an upper FBAR stacked on the lower FBAR, and an acoustic decoupler between the FBARs. Each FBAR comprises opposed planar electrodes and a piezoelectric element between the electrodes. The acoustic decoupler has an acoustic impedance in a range from about 2 Mrayl to about 4 Mrayl. In an embodiment, the acoustic decoupler comprises no more than one acoustic decoupling layer of an acoustic decoupling material having an acoustic impedance in a range from about 2 Mrayl to about 4 Mrayl. In another embodiment, the acoustic decoupler comprises acoustic decoupling layers of acoustic decoupling materials having respective, differing acoustic impedances.

In another aspect, the invention provides a decoupled stacked bulk acoustic resonator (DSBAR) device that comprises a lower film bulk acoustic resonator (FBAR), an upper FBAR stacked on the lower FBAR, and a piezoelectric element between the electrodes. Each FBAR comprises opposed planar electrodes and a piezoelectric element between the electrodes. The acoustic decoupler comprises an acoustic decoupling layer of an acoustic decoupling material having an acoustic impedance of about 2 Mrayl.

BRIEF DESCRIPTION OF THE DRAWINGS

FIG. 3D is an enlarged view of the part of FIG. 3B showing an embodiment of the acoustic decoupler composed of layers of acoustic decoupling materials having different acoustic impedances.

FIG. 3E is an enlarged view similar to FIG. 3D showing an alternative embodiment of the acoustic decoupler.

FIG. 3F is a schematic drawing of the electrical circuits of the example of the FACT shown in FIG. 3A.

FIG. 3G is a schematic drawing of the electrical circuits of an embodiment of the FACT shown in FIG. 3A that includes an inductor to mitigate the effects of parasitic capacitance.

DETAILED DESCRIPTION

Figure 1:
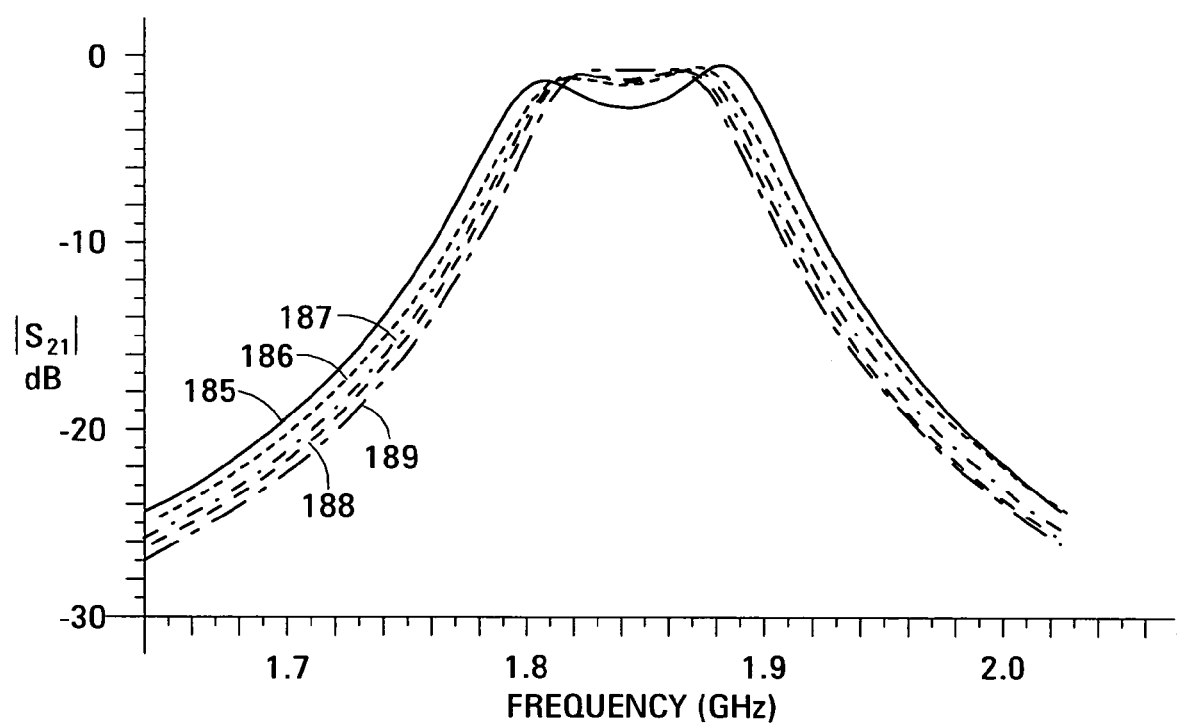
FIG. 1 is a graph comparing the calculated frequency responses of embodiments of a DSBAR device in accordance with the invention having acoustic decouplers with different structures in accordance with the invention.

The applicants have discovered that a multi-layer acoustic decoupler composed of acoustic decoupling layers of acoustic decoupling materials having different acoustic impedances can be used with advantage to define the pass bandwidth of a DSBAR device. In a DSBAR device, a multi-layer acoustic decoupler structured to impose a phase change of an integral multiple of $\pi/2$ radians on an acoustic signal equal in frequency to the center frequency of the pass band of the DSBAR device behaves as if it were a single-layer acoustic decoupler having an effective acoustic impedance different from the acoustic impedances of the acoustic decoupling materials of the multi-layer acoustic decoupler and having a thickness nominally equal to one quarter of the wavelength of an acoustic signal in the acoustic decoupling material of the single-layer acoustic decoupler. References in this disclosure to the acoustic impedance of an acoustic decoupler are to be understood to refer to the effective acoustic impedance of the acoustic decoupler when the acoustic decoupler is a multi-layer acoustic decoupler. A multi-layer acoustic decoupler allows process-compatible acoustic decoupling materials to be used obtain an acoustic impedance (and, hence, pass bandwidth of the DSBAR device) not obtainable with a single-layer acoustic decoupler due to the lack of a process-compatible acoustic decoupling material with the same acoustic impedance.

The acoustic impedance $Z_n$ of an acoustic decoupler with n acoustic decoupling layers is defined by equation (1):

$$Z_n = \frac{\sum_{1}^{n} Z_i \frac{t_i}{v_i}}{\sum_{1}^{n} \frac{t_i}{v_i}} \quad (1)$$

where $Z_i$ is the acoustic impedance of the acoustic decoupling material of acoustic decoupling layer i, $t_i$ is the thickness of acoustic decoupling layer i, and $v_i$ is the velocity of sound in the acoustic decoupling material of acoustic decoupling layer i.

The acoustic decoupler is structured to impose a phase change $\Delta\phi$ of an integral odd multiple of $\pi/2$ radians, i.e., $(2m+1)\pi/2$ radians, where m is an integer, on an acoustic signal nominally equal in frequency to the center frequency of the DSBAR. The phase change $\Delta_\phi$ imposed by the acoustic decoupler is given by:

$$\Delta\varphi = 2\pi f_0 \sum_{1}^{n} \frac{t_i}{v_i} \quad (2)$$

Therefore:

$$\sum_{1}^{n} \frac{t_i}{v_i} = \frac{(2m+1)}{4f_0} \quad (3)$$

In an embodiment in which integer m=0:

$$\sum_{1}^{n} \frac{t_i}{v_i} = \frac{1}{4f_0} \quad (4)$$

Thus, in accordance with the invention, in embodiments of a DSBAR device in which the acoustic impedance of a process-compatible acoustic decoupling material provides the desired pass bandwidth, the acoustic decoupler is composed of a single acoustic decoupling layer of such acoustic decoupling material. Additionally, in embodiments of a DSBAR device in which the desired pass bandwidth is not provided by the acoustic impedance of any single process-compatible acoustic decoupling material, the acoustic decoupler is composed of acoustic decoupling layers typically of two different acoustic decoupling materials, one having an acoustic impedance greater than the desired acoustic impedance, the other having an acoustic impedance less than the desired acoustic impedance. The thicknesses of the acoustic decoupling layers are chosen to set the acoustic impedance of the acoustic decoupler to that which provides the desired pass bandwidth and to set the phase change imposed by the acoustic decouple to an odd integral multiple of π/2 radians.

FIG. 1 shows the calculated pass band frequency response of five exemplary embodiments of a DSBAR device in accordance with the invention. Curve 185 shows the frequency response of an embodiment in which the acoustic decoupler is composed of a single acoustic decoupling layer of a first acoustic decoupling material having an acoustic impedance of about 4 Mrayl. Curve 189 shows the frequency response of an embodiment in which the acoustic decoupler is composed of a single acoustic decoupling layer of a second acoustic decoupling material having an acoustic impedance of about 2 Mrayl. Curves 186, 187 and 188 show the frequency responses of respective embodiments in which the acoustic decoupler is composed of a first acoustic decoupling layer of the first acoustic decoupling material and a second acoustic decoupling layer of the second acoustic decoupling material in which the first acoustic decoupling layer and the second acoustic decoupling layer respectively account for 75% and 25%, 50% and 50%, and 25% and 75%, respectively, of the overall phase shift imposed by the acoustic decoupler. The acoustic decouplers are all structured to impose a nominal phase change of π/2 radians on an acoustic signal having a frequency equal to the center frequency of the pass band of the DSBAR device. The acoustic decouplers of the embodiments represented by curves 185–189 have acoustic impedances of 4.9, 3.3, 3.0, 2.5 and 2.1 Mrayl. FIG. 1 demonstrates how the pass bandwidth of the DSBAR device decreases as the acoustic impedance of the acoustic decoupler decreases.

The frequency responses shown in FIG. 1 exhibit little evidence of spurious artifacts, regardless of whether the acoustic decoupler is composed of a single acoustic decoupling layer (curves 185 and 189) or is composed of two acoustic decoupling layers of acoustic decoupling materials with different acoustic impedances (curves 186–188). The frequency responses of embodiments with two or more acoustic decoupling layers are more likely to exhibit spurious artifacts as the ratio of the acoustic impedances of the acoustic decoupling layers increases above unity: for example, spurious artifacts are likely to be apparent in embodiments in which the acoustic impedance ratio exceeds about six. FIG. 1 will be described in greater detail below.

Figure 2A:
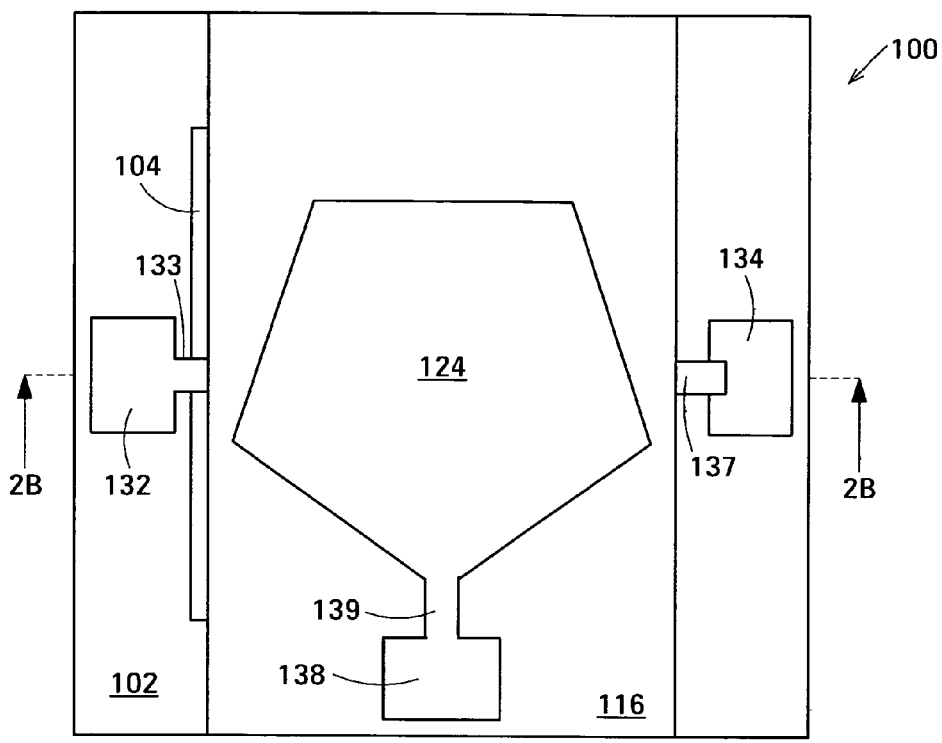
FIG. 2A is a plan view of an embodiment of a band-pass filter as a first example of a DSBAR device in accordance with the invention.
Figure 2B:
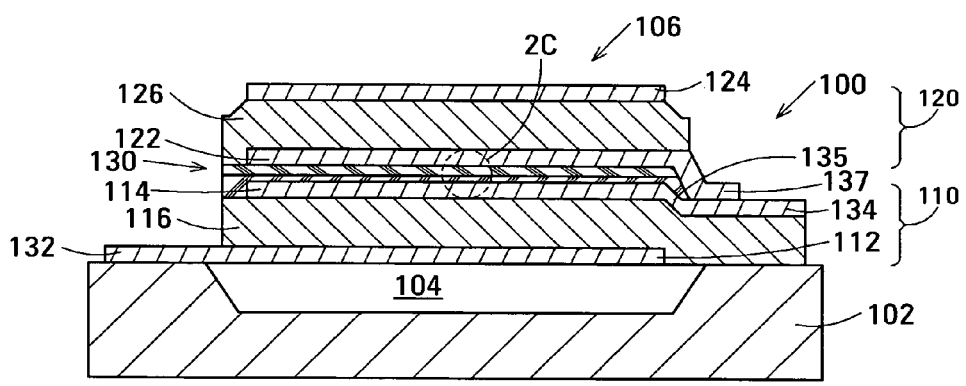
FIG. 2B is a cross-sectional view of the band-pass filter shown in FIG. 2A along the section line 2B—2B in FIG. 2A.

FIG. 2A is a plan view of an exemplary embodiment 100 of a band-pass filter as a first example of a DSBAR device in accordance with the invention. FIG. 2B is a cross-sectional view along the section line 2B—2B in FIG. 2A. Band-pass filter 100 is composed of a DSBAR 106. DSBAR 106 is composed of a lower film bulk acoustic resonator (FBAR) 110, an upper FBAR 120 stacked on lower FBAR 120 and an acoustic decoupler 130 between the FBARs.

FBAR 110 is composed of opposed planar electrodes 112 and 114 and a piezoelectric element 116 between the electrodes. FBAR 120 is composed of opposed planar electrodes 122 and 124 and a piezoelectric element 126 between the electrodes.

Acoustic decoupler 130 is located between FBARs 110 and 120, specifically, between electrode 114 of FBAR 110 and electrode 122 of FBAR 120. The acoustic decoupler controls the coupling of acoustic energy between FBARs 110 and 120. The acoustic decoupler couples less acoustic energy between the FBARs than would be coupled by direct contact between the FBARs. In the example shown in FIG. 2B and in magnified form in FIG. 2C, acoustic decoupler 130 is composed of an acoustic decoupling layer 182 of a first acoustic decoupling material and an acoustic decoupling layer 183 of a second acoustic decoupling material. The acoustic decoupling materials have different acoustic impedances.

In the example shown, DSBAR 106 is suspended over a cavity 104 defined in a substrate 102. This way of suspending the DSBAR allows FBARs 110 and 120 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. Other suspension schemes that allow the FBARs to resonate mechanically in response to an input electrical signal are possible. For example, the DSBAR can be located over a mismatched acoustic Bragg reflector (not shown) formed in or on substrate 102, as disclosed by Lakin in U.S. Pat. No. 6,107,721, the disclosure of which is incorporated into this disclosure by reference.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 134 and 138, respectively, by electrical traces 137 and 139. In an embodiment that provides electrical isolation between input and output, electrical trace 137 is connected to an additional terminal pad (not shown) instead of to terminal pad 134.

Figure 3A:
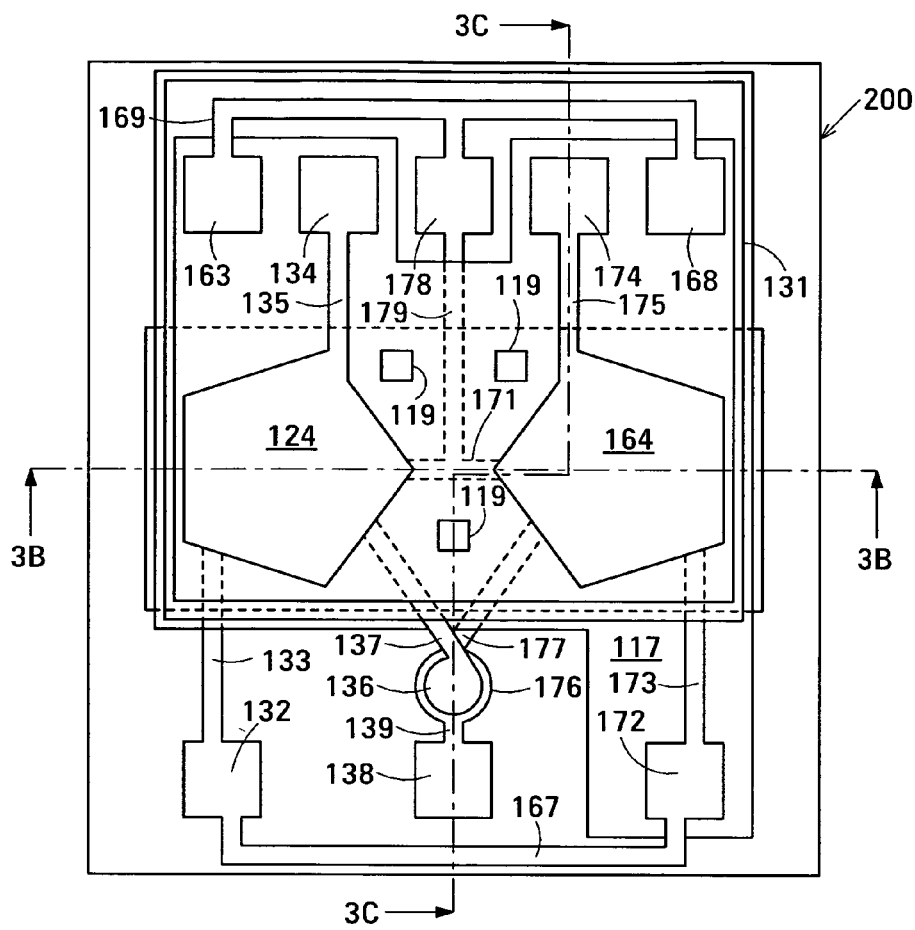
FIG. 3A is a plan view of an embodiment of a film acoustically-coupled transformer (FACT) as a second example of an DSBAR device in accordance with the invention.
Figure 3B:
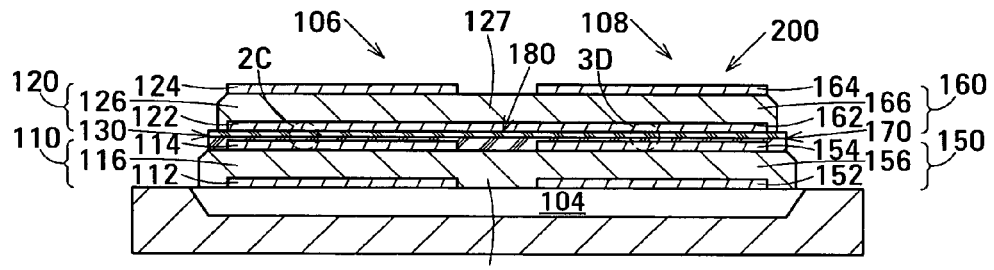
FIG. 3B is a cross-sectional view of the FACT shown in FIG. 3A along the section line 3B—3B.
Figure 3C:
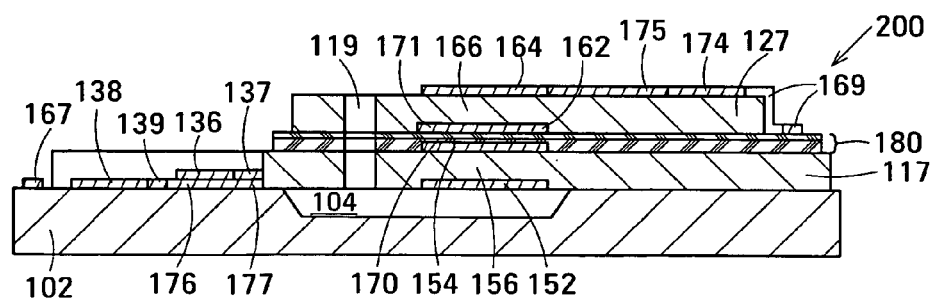
FIG. 3C is a cross-sectional view of the FACT shown in FIG. 3A along the section line 3C—3C.

FIG. 3A is a plan view of an exemplary embodiment 200 of a film acoustically-coupled transformer (FACT) as a second example of an DSBAR device in accordance with the invention. FIGS. 3B and 3C are cross-sectional views along the section lines 3B—3B and 3C—3C, respectively, in FIG. 3A. FIG. 3F is a schematic drawing of the electrical circuits of the example of the FACT shown in FIG. 3A.

FACT 200 is composed of a substrate 102 and decoupled stacked bulk acoustic resonators (DSBARs) 106 and 108. Each DSBAR is composed of a lower film bulk acoustic resonator (FBAR), an upper FBAR and an acoustic decoupler between the FBARs. FACT 200 is additionally composed of an electrical circuit that interconnects the lower FBARs 110 and 150 of DSBARs 106 and 108, respectively, and an electrical circuit that interconnects the upper FBARs 120 and 160 of DSBARs 106 and 108, respectively. FIG. 3F shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and a piezoelectric element 116 between the electrodes, and upper FBAR 120 is composed of opposed planar electrodes 122 and 124 and a piezoelectric element 126 between the electrodes. In DSBAR 108, lower FBAR 150 is composed of opposed planar electrodes 152 and 154 and a piezoelectric element 156 between the electrodes, and upper FBAR 160 is composed of opposed planar electrodes 162 and 164 and a piezoelectric element 166 between the electrodes.

In FACT 200, DSBAR 106 has acoustic decoupler 130 located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another as they would be in a conventional stacked bulk acoustic resonator (SBAR). Additionally, DSBAR 108 has acoustic decoupler 170 located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FACT 200.

In the example shown in FIGS. 3A–3C and in the enlarged view shown in FIG. 3D, acoustic decouplers 130 and 170 are respective parts of an acoustic decoupler 180 composed of acoustic decoupling layers of acoustic decoupling materials having different acoustic impedances. In other embodiments, acoustic decouplers 130 and 170 are structurally independent.

In the example shown, DSBAR 106 and DSBAR 108 are suspended over a common cavity 104 defined in a substrate 102 in a manner similar to that described above with reference to FIGS. 2A and 2B. Other suspension schemes that allow the FBARs constituting the DSBARs to resonate mechanically in response to an input electrical signal are possible, also as described above. DSBAR 106 and DSBAR 108 may alternatively be suspended over respective individual cavities (not shown) in substrate 102.

FIG. 3F schematically shows an example of the electrical circuits that interconnect DSBARs 106 and 108 and connect DSBARs 106 and 108 to external circuitry (not shown). Electrical circuit 141 connects lower FBARs 110 and 150 in anti-parallel and to signal terminal 143 and ground terminal 144. In the embodiment shown in FIGS. 3A–3C, terminal pad 138 provides signal terminal 143 and terminal pads 132 and 172 provide ground terminal 144. In the embodiment, electrical circuit 141 (FIG. 3F) is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace that extends from electrode 154 of FBAR 150 to terminal pad 172 and an electrical trace 167 that interconnects terminal pads 132 and 172.

In the exemplary electrical schematic shown in FIG. 3F, electrical circuit 142 connects upper FBARs 120 and 160 in series and to signal terminals 145 and 146 and to optional center-tap terminal 147. In the embodiment shown in FIGS. 3A–3C, terminal pads 134 and 174 provide signal pads 145 and 146 and terminal pad 178 provides center-tap terminal 147. In the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to center-tap 137, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 3F provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti series to achieve other impedance transformation ratios.

Figure 2C:
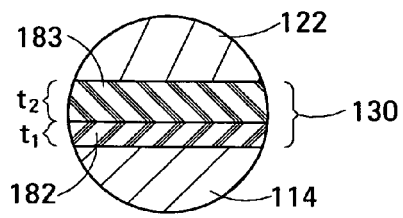
FIG. 2C is an enlarged view of the part of FIG. 2B showing an embodiment of the acoustic decoupler composed of layers of acoustic decoupling materials having different acoustic impedances.
Figure 2D:
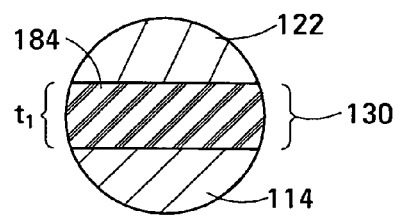
FIG. 2D is an enlarged view similar to FIG. 2C showing an alternative embodiment of the acoustic decoupler.

Referring now to FIGS. 2C and 2D, and additionally to FIGS. 2A and 2B, FIG. 2C is an enlarged view of part of FIG. 2B showing part of a first exemplary embodiment of acoustic decoupler 130 of the DSBAR 106 of band-pass filter 100. This embodiment of acoustic decoupler 130 is composed of acoustic decoupling layers 182 and 183 of acoustic decoupling materials having different acoustic impedances that collectively provide acoustic decoupler 130 with an acoustic impedance that provides band-pass filter 100 with its desired pass bandwidth. FIG. 2D is an enlarged view of part of FIG. 2B showing part of a second exemplary embodiment of acoustic decoupler 130 of the DSBAR 106 of band-pass filter 100. This embodiment of acoustic decoupler 130 is composed of a single acoustic decoupling layer 184 of an acoustic decoupling material having an acoustic impedance that provides band-pass filter 100 with its desired pass bandwidth. FIGS. 2C and 2D each additionally show parts of the electrodes 114 and 122 of FBARs 110 and 120, respectively (FIG. 2B) between which acoustic decoupler 130 is located.

Referring now to FIGS. 3D and 3E, and additionally to FIGS. 3A–3C, FIG. 3D is an enlarged view of part of FIG. 3B showing part of a first exemplary embodiment of acoustic decoupler 170 of DSBAR 108. This embodiment of acoustic decoupler 170 is composed of acoustic decoupling layers 182 and 183 of acoustic decoupling materials having different acoustic impedances that collectively provide acoustic decoupler 170 with an acoustic impedance that provides FACT 200 with its desired pass bandwidth. FIG. 3E is an enlarged view of part of FIG. 3B showing part of a second exemplary embodiment of acoustic decoupler 170 of DSBAR 108. This embodiment of acoustic decoupler 170 is composed of a single acoustic decoupling layer 184 of an acoustic decoupling material having an acoustic impedance that provides FACT 200 with its desired pass bandwidth. FIGS. 3D and 3E each additionally show parts of the electrodes 154 and 162 of FBARs 150 and 160, respectively, (FIG. 3B) between which acoustic decoupler 170 is located. The acoustic decoupler 130 of DSBAR 106 is identical in structure to acoustic decoupler 170 and to acoustic decoupler 130 shown in FIGS. 2B and 2C.

The embodiment of acoustic decoupler 130 of band-pass filter 100 shown in FIG. 2C will now be described in more detail with reference to that Figure and FIG. 2B. Acoustic decoupler 180 that provides acoustic decouplers 130 and 170 shown in FIGS. 3B–3E is similar in structure and properties. Accordingly, the following description of acoustic decoupler 130 also applies to the acoustic decouplers shown in FIGS. 3B–3E, and the acoustic decouplers shown in FIGS. 3B–3E will not be separately described.

In the example shown in FIG. 2C, acoustic decoupler 130 is composed of an acoustic decoupling layer 182 of a first acoustic decoupling material having an acoustic impedance $Z_1$ and a second acoustic decoupling layer 183 of a second acoustic decoupling material having an acoustic impedance $Z_2$, different from acoustic impedance $Z_1$. The velocity of sound in the first acoustic decoupling material is $v_1$ and the velocity of sound in the second acoustic decoupling material is $v_2$. First acoustic decoupling layer 182 has a nominal thickness $t_1$ and second acoustic decoupling layer 183 has a nominal thickness $t_2$.

Band-pass filter 100 has a band-pass frequency response. The band-pass response has a pass bandwidth that depends on the acoustic impedance $Z_2$ of acoustic decoupler 130. The acoustic impedance of acoustic decoupler 130 is intermediate between the acoustic impedances $Z_1$ and $Z_2$ of the acoustic decoupling materials of acoustic decoupling layers 182 and 183, respectively. Specifically, the acoustic impedance of acoustic decoupler 130 is given by:

$$Z_2 = ((Z_1 t_1/v_1) + (Z_2 t_2/v_2))/((v_1/t_1) + (v_2/t_2)) \quad (5).$$

Acoustic decoupler 130 is structured to impose a nominal phase change of an odd integral multiple of $\pi/2$ radians (i.e., $(2m+1)\pi/2$, where m is an integer equal to or greater than zero) on an acoustic signal having a frequency $f_0$ equal to the center frequency of the pass band of DSBAR device 100. Such an acoustic decoupler has a total thickness $(t_1+t_2)$ nominally equal to an odd integral multiple of one quarter of the wavelength $\lambda_n$ in the acoustic decoupler of an acoustic signal having a frequency equal to the center frequency of the pass band of the DSBAR device. A phase change of $(2m+1)\pi/2$ corresponds to a propagation time through acoustic decoupler 130 of $(2m+1)/(4f_0)$. In the example shown, acoustic decoupler 130 is composed of acoustic decoupling layers 182 and 183 having thicknesses of $t_1$ and $t_2$, respectively, and in which the velocity of sound is $v_1$ and $v_2$, respectively. The propagation time through acoustic decoupler 130 is given by $(t_1/v_1+t_2/v_2)$. Therefore:

$$(t_1/v_1+t_2/v_2) = (2m+1)/(4f_0) \quad (6).$$

In an embodiment in which integer m=0:

$$(t_1/v_1+t_2/v_2) = 1/(4f_0) \quad (7).$$

From equations (5) and (6) or (7) can be calculated values of the thicknesses $t_1$ and $t_2$ of acoustic decoupling layers 182 and 183 that give acoustic decoupling layer 130 a desired acoustic impedance and a structure that imposes a nominal phase change of $(2m+1)\pi/2$ or $\pi/2$ on an acoustic signal having a frequency equal to the center frequency of the pass band of DSBAR device 100. Moreover, the bandwidth of DSBAR device 100 can be changed simply by changing the thicknesses of acoustic decoupling layers 182 and 183 to change the acoustic impedance of acoustic decoupler 130 while maintaining the nominal phase change imposed by the acoustic decoupler equal to $(2m+1)\pi/2$ radians. This will be described in more detail below with reference to FIG. 1.

A minimum-thickness embodiment of acoustic decoupler 130, i.e., an embodiment in which the acoustic decoupler is structured to impose a nominal phase change of $\pi/2$ radians (m=0) on an acoustic signal having a frequency equal to the center frequency $f_0$ of the pass band of DSBAR device 100, has a frequency response substantially closer to an ideal frequency response than thicker acoustic decouplers that impose a nominal phase change of an odd integral multiple greater than unity (m>0) of $\pi/2$ radians, i.e., $3\pi/2, 5\pi/2, \ldots$, $(2m+1)\pi/2$, on the above-mentioned acoustic signal of frequency $f_0$. The frequency response of a DSBAR device having a minimum-thickness acoustic decoupler (m=0) lacks the spurious artifacts exhibited by a DSBAR device having a thicker acoustic decoupler (m>0).

The smooth frequency response that results from using a minimum-thickness acoustic decoupler is obtained at the expense of the parasitic capacitor formed by electrodes 114 and 122 and acoustic decoupler 130 having a substantially greater capacitance than that of an embodiment having a thicker acoustic decoupler. In applications in which the parasitic capacitance is problematic, such as applications in which a high common mode rejection ratio is desired, the parasitic capacitance can be tuned out by connecting an inductor in parallel with the parasitic capacitor, i.e., by connecting the inductor between electrodes 114 and 122, as shown in FIG. 3G. A blocking capacitor (not shown) may be connected in series with the inductor to provide DC isolation if DC isolation is needed. The use of an inductor to tune out the effects of the parasitic capacitor is disclosed by Larson III et al. in the above-mentioned U.S. patent application Ser. No. 10/965,586 entitled Film Acoustically-Coupled Transformer with Increased Common Mode Rejection.

FIG. 3G shows a capacitor symbol labelled $C_P$ and depicted by broken lines that represents the parasitic capacitor $C_P$ composed of electrodes 114 and 122 and acoustic decoupler 130. The capacitance of the parasitic capacitor is a maximum in embodiments in which acoustic decoupler 130 is a minimum-thickness acoustic decoupler, as described above. In FACT 200, an inductor 195 is connected between electrode 114 and electrode 122 on opposite sides of acoustic decoupler 130. This connects inductor 195 in parallel with parasitic capacitor $C_P$. Inductor 195 and the parallel combination of parasitic capacitor $C_P$ and the capacitance $C_0$ between terminals 143 and 144 form a parallel resonant circuit 196 having a resonant frequency in the pass band. In one embodiment, the resonant frequency is equal to the center frequency of the pass band of FACT 200.

An embodiment of acoustic decoupler 130 in which acoustic decoupling layers 182 and 183 have thicknesses that differ from the thicknesses described above by less than approximately ±10% of the respective thicknesses can alternatively be used. Thicknesses outside this range can alternatively be used with some degradation in performance. However, the thicknesses of acoustic decoupling layers 182 and 183 should differ significantly from thicknesses that would result in acoustic decoupler 130 imposing a nominal phase change of an integral even multiple of $\pi/2$ on an acoustic signal having a frequency equal to the center frequency of the pass band of the DSBAR device.

Returning again to FIGS. 3A–3F, the acoustic decoupling materials of acoustic decoupling layers 182 and 183 constituting acoustic decoupler 130 of DSBAR device 100 have acoustic impedances significantly different from the acoustic impedances of the materials of the electrodes and the piezoelectric elements that constitute FBARs 110, 120. In the examples shown, the acoustic decoupling materials of acoustic decoupling layers 182 and 183 have acoustic impedances less than the acoustic impedances of the materials of the electrodes and the piezoelectric elements that constitute FBARs 110, 120. The piezoelectric material of piezoelectric elements 116 and 126 of the FBARs is typically aluminum nitride (AlN) and the electrode material of electrodes 112, 114, 122 and 124 is typically molybdenum (Mo). The acoustic impedance of AlN is typically about 35 Mrayl and that of Mo is about 63 Mrayl. In embodiments of band-pass filter 100 in which the materials of FBARs 110, 120 are as stated above, a desired range of pass bandwidths is obtained with an acoustic decoupler having an acoustic impedance in the range from about 2 Mrayl to about 4 Mrayl. In embodiments of band-pass filter 100 that additionally provide electrical isolation between input and output, at least one of the acoustic decoupling materials additionally has a high electrical resistivity and a low dielectric permittivity.

In an embodiment, acoustic decoupling layers 182 and 183 constituting acoustic decoupler 130 are formed by spin coating respective acoustic decoupling materials over electrode 114. A layer formed by spin coating may have regions of different thickness due to the contouring of the surface to which the acoustic decoupling materials are applied. In this event, the thickness of acoustic decoupling layers 182 and 183 is the thickness of the portion of the acoustic decoupling layers located between electrodes 114 and 122.

As noted above, relatively few acoustic decoupling materials are capable of withstanding the temperatures and etchants of the fabrication operations performed after acoustic decoupling layers 182 and 183 have been deposited on electrode 114 to form acoustic decoupler 130. As will be described in more detail below, in practical embodiments of band-pass filter 100, electrodes 122 and 124 and piezoelectric element 126 are deposited by sputtering after acoustic decoupler 131 has been formed. Temperatures as high as 400° C. are reached during these deposition processes. Moreover, a release etch using hydrofluoric acid is performed to remove sacrificial material from between substrate 102 and DSBAR 106. Thus, plastics that remain stable at such temperatures and in the presence of such etchants are used as the acoustic decoupling materials of acoustic decoupling layers 182 and 183.

Plastic acoustic decoupling materials typically have a very high acoustic attenuation per unit length compared with the other materials of FBARs 110 and 120. However, since the total thickness of acoustic decoupler 130 is typically less than 1 μm, the acoustic attenuation introduced by acoustic decoupler 130 is typically negligible.

In one exemplary embodiment of DSBAR devices 100 and 200, a polyimide is used as the acoustic decoupling material of acoustic decoupling layer 182 and a crosslinked polyphenylene polymer is used as the acoustic decoupling material of acoustic decoupling layer 183.

Polyimide is sold under the registered trademark Kapton by E. I. du Pont de Nemours and Company. Polyimide has an acoustic impedance of about 4 Mrayl and is applied by spin coating.

Crosslinked polyphenylene polymers have been developed as low dielectric constant dielectrics for use in integrated circuits and consequently remain stable at the high temperatures to which acoustic decoupler 130 is subject during the subsequent fabrication of FBAR 120. The inventors have discovered that crosslinked polyphenylene polymers additionally have a calculated acoustic impedance of about 2 Mrayl. This is sufficiently different from the acoustic impedance of polyimide to allow embodiments of acoustic decoupler 130 composed of an acoustic decoupling layer of polyimide and and acoustic decoupling layer of a crosslinked polyphenylene polymer to have a useful range of acoustic impedances. However, the acoustic impedance of the crosslinked polyphenylene polymer is not so different from that of polyimide as to cause spurious artifacts in the frequency response of the DSBAR device.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., Development of Low-Dielectric Constant Polymer for the Fabrication of Integrated Circuit Interconnect, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the range from about 40 nm to about 200 nm, which is the typical range of thicknesses of acoustic decoupling layers 182, 183 and 184.

With acoustic decoupling layers 182 and 183 of polyimide and a crosslinked polyphenylene polymer, respectively, embodiments of acoustic decoupler 130 with acoustic impedances in the range from greater than about 2.1 Mrayl to less than about 4 Mrayl can be fabricated. The acoustic impedance of and phase change imposed by acoustic decoupler 130 depend on the thicknesses of the acoustic decoupling layers. The acoustic decoupling materials of acoustic decoupling layers 182 and 183 may alternatively be a crosslinked polyphenylene polymer and polyimide, respectively.

An embodiment of acoustic decoupler 130 having an acoustic impedance equal to that of polyimide or to that of the crosslinked polyphenylene polymer is obtained by using the embodiment of acoustic decoupling layer 130 shown in FIG. 2D. In this embodiment, acoustic decoupler 130 is composed of a single acoustic decoupling layer 184 of either polyimide or the crosslinked polyphenylene polymer. Single acoustic decoupling layer 184 has a thickness that imposes a nominal phase change of an odd integral multiple of π/2 on an acoustic signal having a frequency equal to the center frequency of the pass band of DSBAR device 100.

FIG. 3E shows an embodiment of acoustic decoupler 170 of DSBAR device 200 in which an acoustic impedance equal to that of polyimide or to that of the crosslinked polyphenylene polymer is obtained by using a single acoustic decoupling layer 184 of either polyimide or the crosslinked polyphenylene polymer, respectively, as acoustic decoupler 180.

Referring once more to FIGS. 3A–3F, in another embodiment of acoustic decoupler 130, a poly(para-xylylene) is used as the acoustic decoupling material of one of acoustic decoupling layers 182 and 183. In such embodiment, one of acoustic decoupling layers 182 and 183 is a layer of poly (para-xylylene) applied to electrode 114 or to the other of the acoustic decoupling layers by vacuum deposition. Poly (para-xylylene) is also known in the art as parylene. The dimer precursor di-para-xylylene from which parylene is made and equipment for performing vacuum deposition of layers of parylene are available from many suppliers. Parylene has a calculated acoustic impedance of about 2.8 Mrayl. Thus, using parylene as the acoustic decoupling material of one of acoustic decoupling layers 182 and 183 would give an acoustic impedance range from greater than about 2.1 Mrayl to less than about 2.8 Mrayl in embodiments in which the acoustic decoupling material of the other of the acoustic decoupling layers is a crosslinked polyphenylene polymer, and from greater than about 2.8 Mrayl to less than about 4 Mrayl in embodiments in which the acoustic decoupling material of the other of the acoustic decoupling layers is polyimide. Paralene may also be used as the acoustic decoupling material of single acoustic decoupling layer 184 shown in FIG. 2D and FIG. 3E.

In alternative embodiments of acoustic decoupler 130, the acoustic decoupling materials of acoustic decoupling layers 182 and 183 or of acoustic decoupling layer 184 have acoustic impedances substantially greater than the acoustic impedances of the materials of FBARs 110 and 120. No acoustic decoupling materials having this property are known at this time, but such materials may become available in future. Alternatively, FBAR materials with lower acoustic impedances may become available in future. The thicknesses of acoustic decoupling layers 182 and 183 or of acoustic decoupling layer 184 of such high acoustic impedance acoustic decoupling layers are calculated as described above.

FIG. 1 shows how the calculated frequency response of band-pass filter 100 depends on the acoustic impedance of acoustic decoupler 130. The embodiment illustrated has a center frequency of about 1,850 MHz. FIG. 1 shows calculated frequency responses of the band-pass filter with various embodiments of acoustic decoupler 130 as follows. Curve 185 shows the frequency response with an embodiment of acoustic decoupler 130 having an acoustic impedance of about 4 Mrayl and structured as shown in FIG. 2D as a single acoustic decoupling layer 184 of polyimide. Curve 186 shows the frequency response with an embodiment of acoustic decoupler 130 having an acoustic impedance of about 3.3 Mrayl and structured as shown in FIG. 2C as an acoustic decoupling layer 182 of polyimide and an acoustic decoupling layer 183 of a crosslinked polyphenylene polymer in which acoustic decoupling layers 182 and 183 contributed about 75% and about 25%, respectively, of the total phase change imposed by acoustic decoupler 130. The crosslinked polyphenylene polymer had an acoustic impedance of about 2 Mrayl. Curve 187 shows the frequency response with an embodiment of acoustic decoupler 130 having an acoustic impedance of about 3.0 Mrayl and structured as shown in FIG. 2C as an acoustic decoupling layer 182 of polyimide and an acoustic decoupling layer 183 of the crosslinked polyphenylene polymer in which the thicknesses of acoustic decoupling layers 182 and 183 each contributed about one half of the total phase change imposed by acoustic decoupler 130. Curve 188 shows the frequency response with an embodiment of acoustic decoupler 130 having an acoustic impedance of about 2.5 Mrayl and structured as shown in FIG. 2C as an acoustic decoupling layer 182 of polyimide and an acoustic decoupling layer 183 of the crosslinked polyphenylene polymer in which acoustic decoupling layers 182 and 183 contributed about 25% and about 75%, respectively, of the total phase change imposed by acoustic decoupler 130. Curve 189 shows the frequency response with an embodiment of acoustic decoupler 130 having an acoustic impedance of about 2.1 Mrayl and structured as shown in FIG. 2D as a single acoustic decoupling layer 184 of the crosslinked polyphenylene polymer.

Table 1 shows the dependence of the calculated pass bandwidths of the above embodiments of band-pass filter 100 on the thicknesses of the one or more acoustic decoupling layers. The pass bandwidth is taken at −3 dB relative to the maximum.

TABLE 1

| Thickness of acoustic decoupling layer 182/184 (polyimide) (nm) | Thickness of acoustic decoupling layer 183/184 (crosslinked polyphenylene polymer) (nm) | Calculated acoustic impedance of acoustic decoupler 130 | Pass Bandwidth (−3 dB) (MHz) |
|---|---|---|---|
| 200 | 0 | 4.0 | 110 |
| 187.5 | 50 | 3.5 | 95 |
| 100 | 100 | 3.0 | 87 |
| 60 | 127.5 | 2.5 | 83 |
| 0 | 187.5 | 2.1 | 75 |

It can be seen that the pass bandwidth of band-pass filter 100 increases as the fractional thickness of the polyimide acoustic decoupling layer 182 increases and, hence, the acoustic impedance of acoustic decoupler 130 increases. Accordingly, by making an appropriate choice of the thicknesses of acoustic decoupling layers 182 and 183, embodiments of band-pass filter 100 having a desired pass bandwidth can be made.

Wafer-scale fabrication is used to fabricate thousands of DSBAR devices similar to band-pass filter 100 or FACT 200 at the same time. Such wafer-scale fabrication makes the DSBAR devices inexpensive to fabricate. An exemplary method for fabricating an exemplary embodiment of FACT 200 will be described next with reference to the plan views of FIGS. 4A–4J and the cross-sectional views of FIGS. 4K–4T. The same process with different masks can be used to fabricate band-pass filter 100. The pass band of the embodiment of FACT 200 whose fabrication will be described has a nominal center frequency of about 1.9 GHz. Embodiments for operation at other frequencies are similar in structure and fabrication but will have thicknesses and lateral dimensions different from those exemplified below.

A wafer of single-crystal silicon is provided. A portion of the wafer constitutes, for each FACT being fabricated, a substrate corresponding to the substrate 102 of FACT 200. FIGS. 4A–4H and FIGS. 4I–4P illustrate, and the following description describes, the fabrication of FACT 200 in and on a portion of the wafer. As FACT 200 is fabricated, the other FACTs on the wafer are similarly fabricated.

Figure 4A:
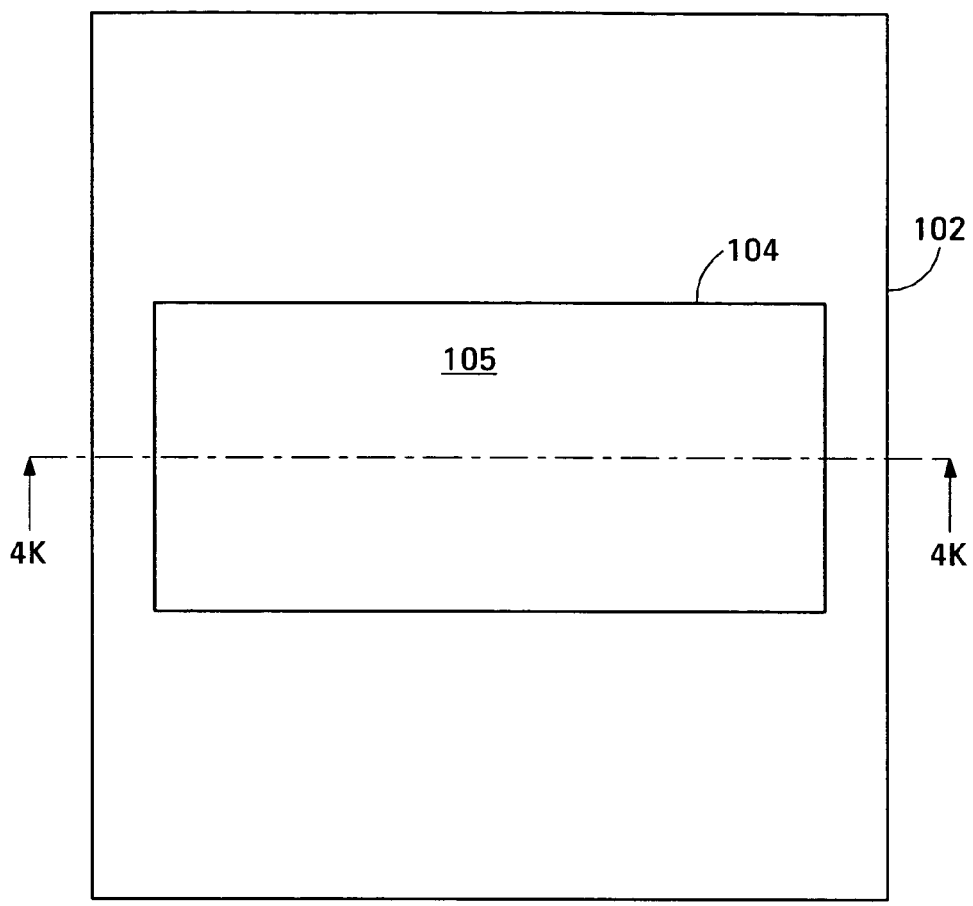
FIGS. 4A–4J are plan views illustrating a process for making a DSBAR device in accordance with the invention.
Figure 4K:
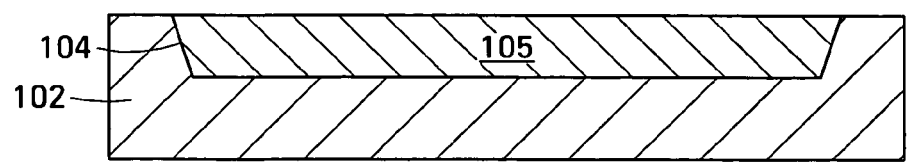
FIGS. 4K–4T are cross-sectional views along the section lines 4K—4K, 4L—4L, 4M—4M, 4N—4N, 4O—4O, 4P—4P, 4Q—4Q, 4R—4R, 4S—4S and 4T—4T in FIGS. 4A–4J, respectively.

The portion of the wafer that constitutes the substrate 102 of FACT 200 is selectively wet etched to form a cavity 104, as shown in FIGS. 4A and 4K. A layer of fill material (not shown) is deposited on the surface of the wafer with a thickness sufficient to fill each cavity. The surface of the wafer is then planarized, leaving each cavity filled with fill material. FIGS. 4A and 4K also show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

Figure 4B:
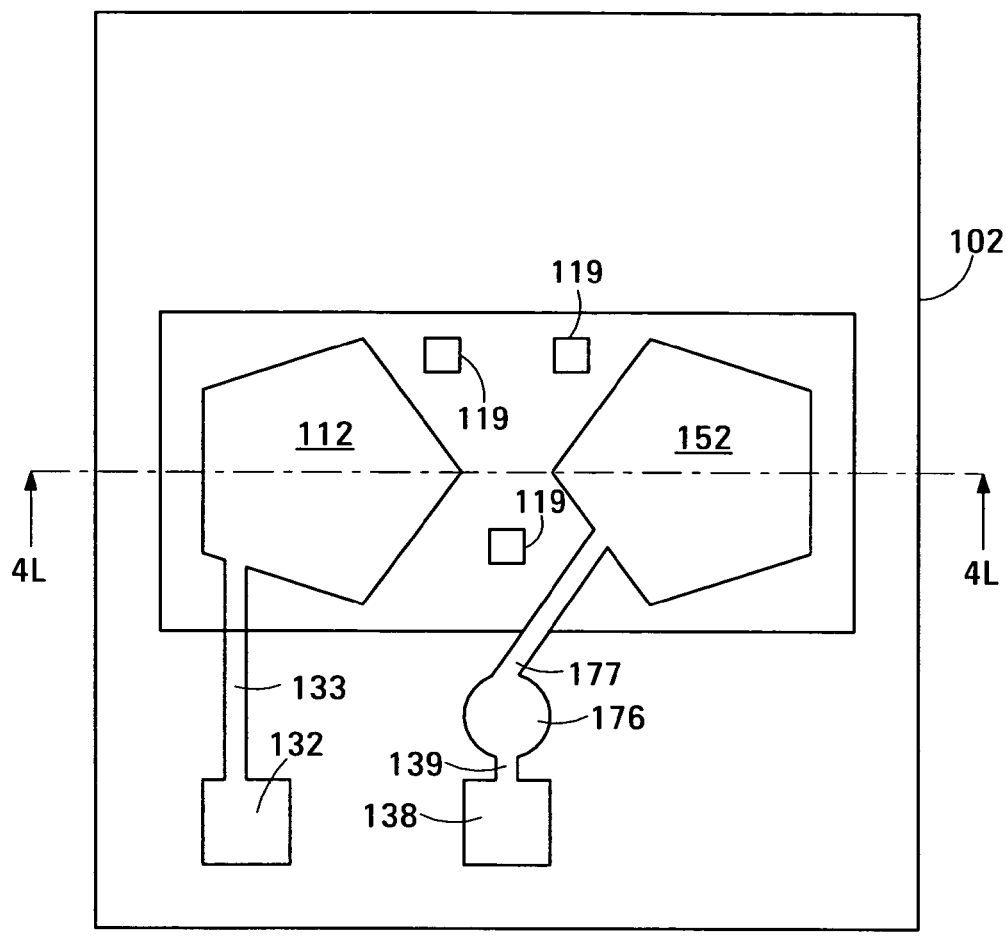
Figure 4L:
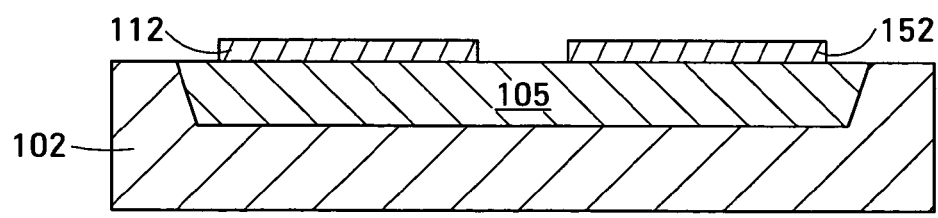

A first metal layer is deposited on the major surface of substrate 102 and fill material 105. The first metal layer is patterned as shown in FIGS. 4B and 4L to define electrode 112, electrode 152, terminal pad 132, terminal pad 138 and interconnection pad 176. The patterning also defines in the first metal layer electrical trace 133 extending between electrode 112 and terminal pad 132, electrical trace 177 extending between electrode 152 and interconnection pad 176, and electrical trace 139 extending between interconnection pad 176 and terminal pad 138.

Electrode 112 and electrode 152 typically have an asymmetrical shape in a plane parallel to the major surface of the wafer. An asymmetrical shape minimizes lateral modes in FBAR 110 and FBAR 150 (FIG. 3B) of which the electrodes form part. This is described in U.S. Pat. No. 6,215,375 of Larson III et al., the disclosure of which is incorporated into this disclosure by reference. Electrode 112 and electrode 152 leave part of the surface of fill material 105 exposed so that the fill material can later be removed by etching, as will be described below.

Referring additionally to FIG. 3B, electrodes 114 and 154 are defined in a second metal layer, electrodes 122 and 162 are defined in a third metal layer and electrodes 124 and 164 are defined in a fourth metal layer, as will be described in detail below. The metal layers in which the electrodes are defined are patterned such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 152 and 154 of FBAR 150 have the same shape, size, orientation and position and electrodes 162 and 164 of FBAR 160 have the same shape, size, orientation and position. Typically, electrodes 114 and 122 additionally have the same shape, size, orientation and position and electrodes 154 and 162 additionally have the same shape, size, orientation and position.

In an embodiment, the material of each of the metal layers was molybdenum deposited by sputtering to a thickness of about 300 nm. The metal layers were each patterned by dry etching. The electrodes defined in each of the metal layers were pentagonal each with an area of about 12,000 square µm. Other electrode areas give other characteristic impedances. Other refractory metals such as tungsten, niobium and titanium may alternatively be used as the material of the metal layers. The metal layers may each alternatively comprise layers of more than one material. One factor to be considered in choosing the material of the electrodes of FACT 200 is the acoustic properties of the electrode material: the acoustic properties of the material(s) of the remaining metal parts of FACT 200 are less important than other properties such as electrical conductivity. Thus, material(s) of the remaining metal parts of FACT 200 may be different from the material of the electrodes.

Figure 4C:
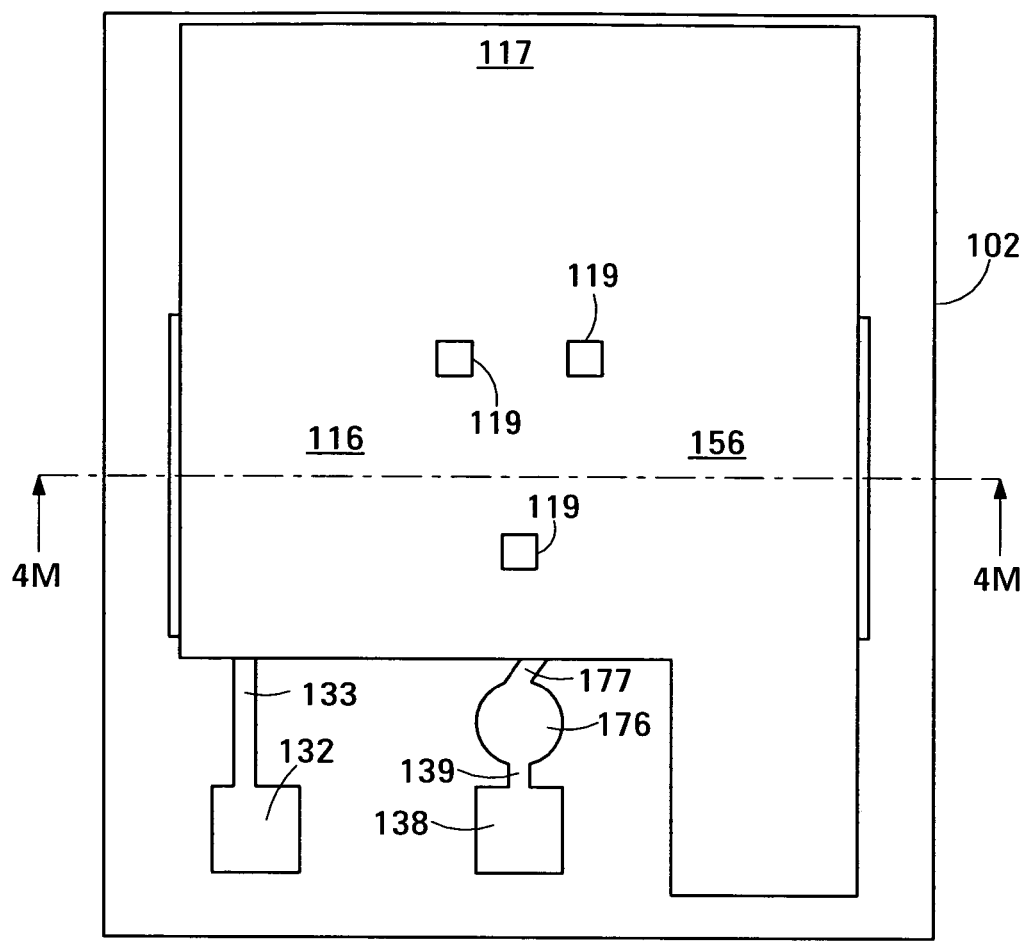
Figure 4M:
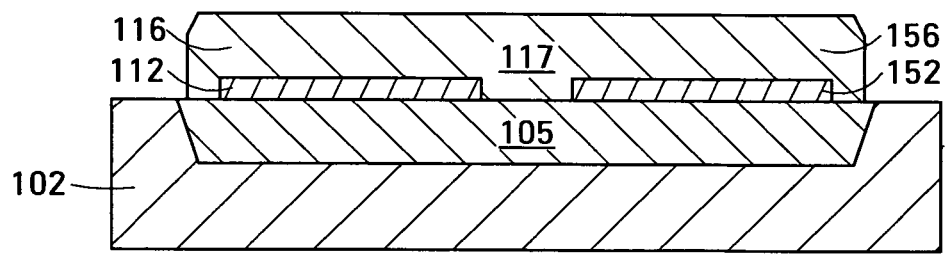

A layer of piezoelectric material is deposited and is patterned as shown in FIGS. 4C and 4M to define a piezoelectric layer 117 that provides piezoelectric element 116 of FBAR 110 and piezoelectric element 156 of FBAR 150. Piezoelectric layer 117 extends over substrate 102 beyond the extent of cavity 104 to provide support for terminal pads 163, 134, 178, 174, 168 and 172, described below. Piezoelectric layer 117 is patterned to expose part of the surface of fill material 105, terminal pads 132 and 138 and interconnection pad 176. Piezoelectric layer 117 is additionally patterned to define windows 119 that provide access to additional parts of the surface of the fill material. Piezoelectric layer 117 may alternatively be patterned to define piezoelectric elements 116 and 156 independently.

In an embodiment, the piezoelectric material deposited to form piezoelectric layer 117 and piezoelectric layer 127 described below was aluminum nitride deposited by sputtering to a thickness of about 1.4 µm. The piezoelectric material was patterned by wet etching in potassium hydroxide or by chlorine-based dry etching. Alternative materials for the piezoelectric layers include zinc oxide, cadmium sulfide and poled ferroelectric materials such as perovskite ferroelectric materials, including lead zirconium titanate, lead meta niobate and barium titanate.

Figure 4D:
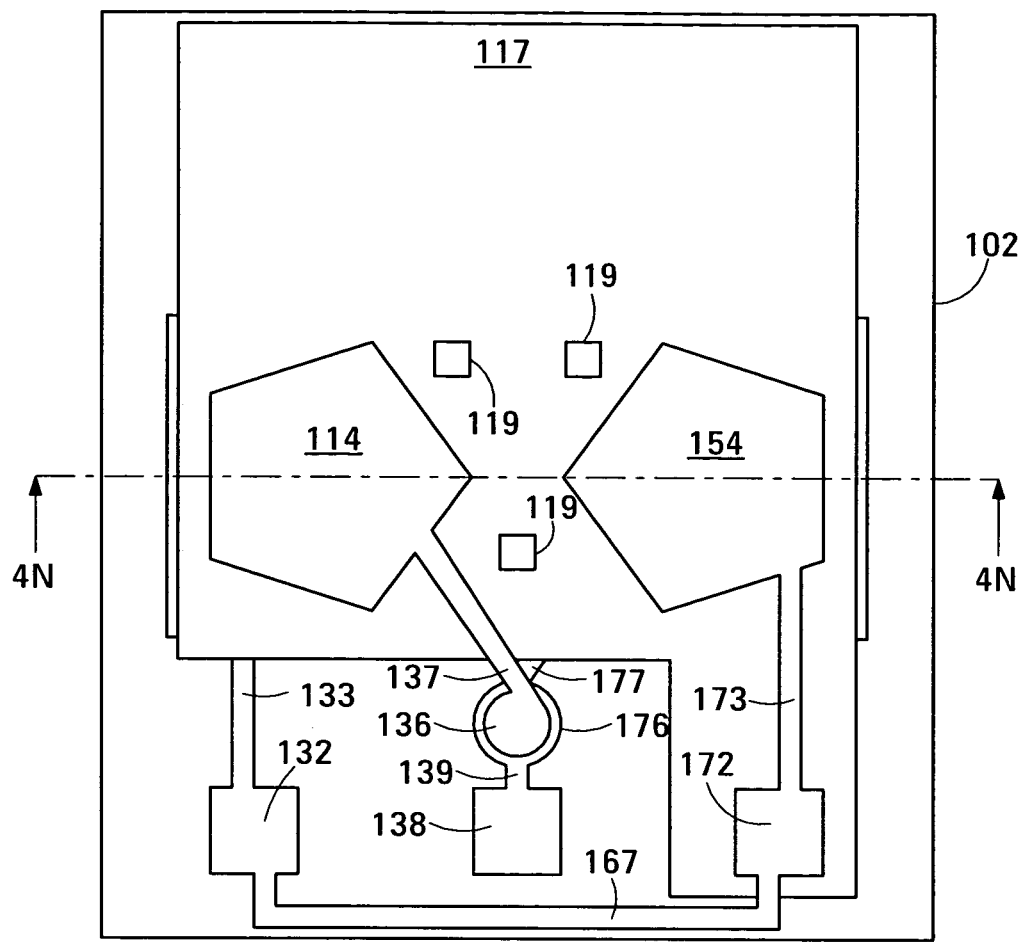
Figure 4N:
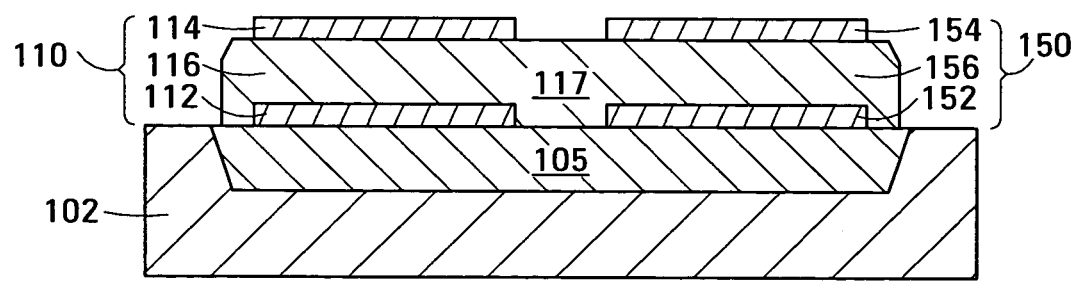

A second metal layer is deposited on piezoelectric layer 117 and is patterned as shown in FIGS. 4D and 4N to define electrode 114, electrode 154, terminal pad 172, and interconnection pad 136 in electrical contact with interconnection pad 176. The patterning additionally defines in the second metal layer electrical trace 137 extending between electrode 114 and interconnection pad 136, electrical trace 173 extending between electrode 154 and terminal pad 172, and electrical trace 167 extending between terminal pads 132 and 172.

Figure 4E:
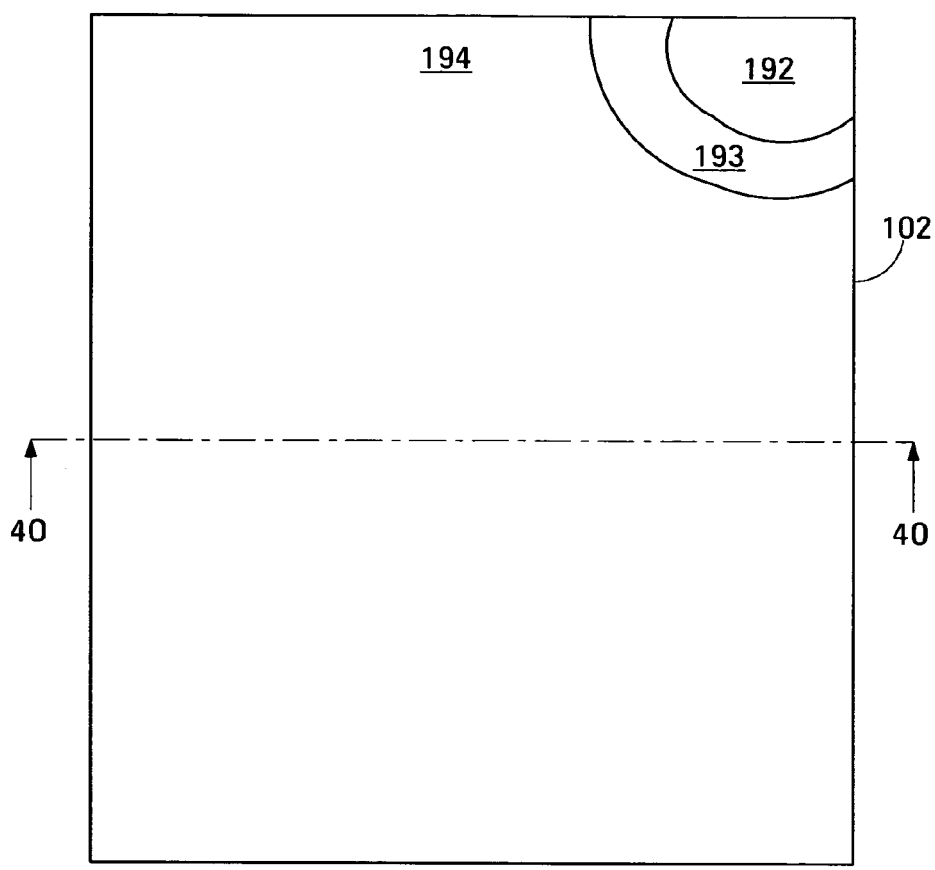
Figure 4O:
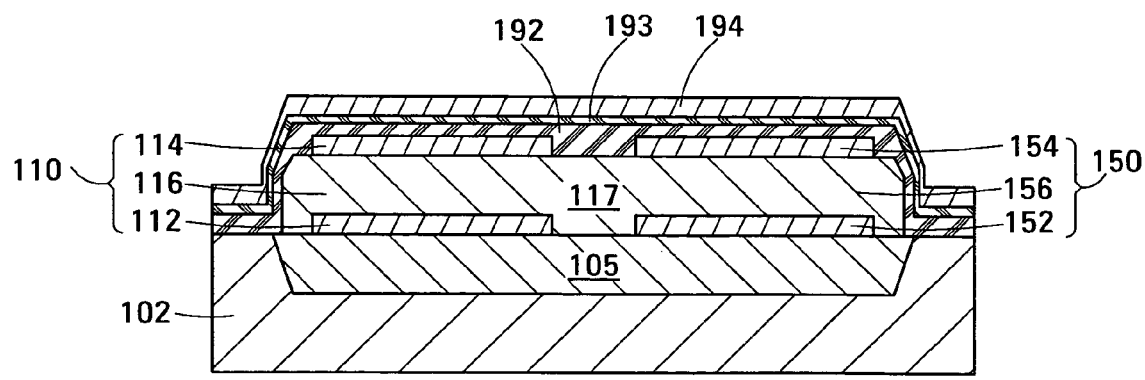

A first layer 192 of a first acoustic decoupling material is then deposited, followed by a second layer 193 of a second acoustic decoupling material as shown in FIGS. 4E and 4N. The second acoustic decoupling material differs in acoustic impedance from the first acoustic decoupling material. A third metal layer 194 is then deposited, also as shown in FIGS. 4E and 4N. In FIG. 4E, part of layer 194 is cut away to show part of layer 193 and part of layer 193 is cut away to show part of layer 192.

In an embodiment, first layer 192 had a thickness in the range from about 50 nm to about 190 nm and the first acoustic decoupling material was polyimide deposited by spin coating. In this embodiment, second layer 193 had a thickness in the range from about 50 nm to about 140 nm and the second acoustic decoupling material was the crosslinked polyphenylene polymer deposited by spin coating. To form second layer 193, a precursor solution composed of an oligomer prepared from biscyclopentadienone- and aromatic acetylene-containing monomers was deposited by spin coating. In an embodiment, the precursor solution for the crosslinked polyphenylene polymer was one sold by The Dow Chemical Company as SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

The actual thicknesses to which acoustic decoupling layers 192 and 193 were deposited depends on the desired acoustic impedance of acoustic decoupler 180 and the pass band center frequency of FACT 200, as described above. The crosslinked polyphenylene polymer may alternatively be deposited as first layer 192 and polyimide may alternatively be deposited as layer 193. Parylene, discussed above, may alternatively be deposited by vacuum deposition as the acoustic decoupling material of either layer 192 or layer 193.

In embodiments in which one of the acoustic decoupling materials is polyimide, after deposition of the layer of polyimide, the wafer is baked initially at a temperature of about 250° C. in air and finally at a temperature of about 415° C. in an inert atmosphere such as nitrogen before further processing is performed. The bake evaporates volatile constituents of the polyimide and prevents the evaporation of such volatile constituents during subsequent processing from causing separation of subsequently-deposited layers. In embodiments in which one of the acoustic decoupling materials is a crosslinked polyphenylene polymer, after deposition of the layer of the precursor solution, the wafer is baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

Figure 4F:
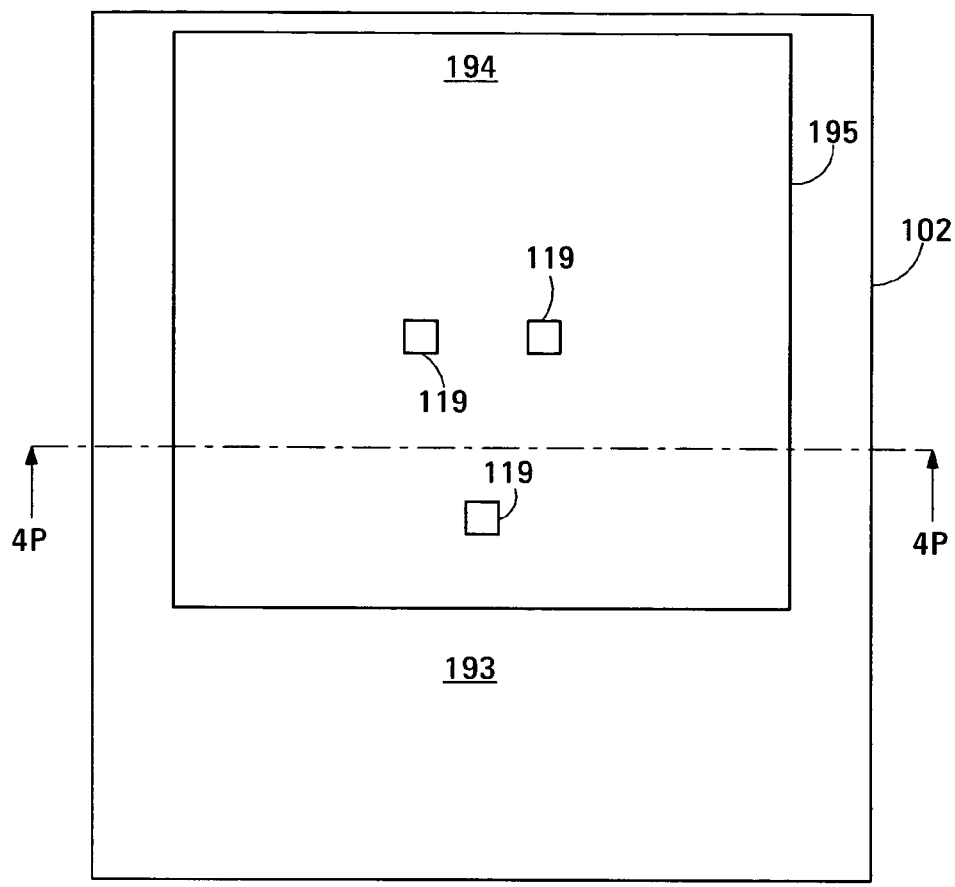
Figure 4P:
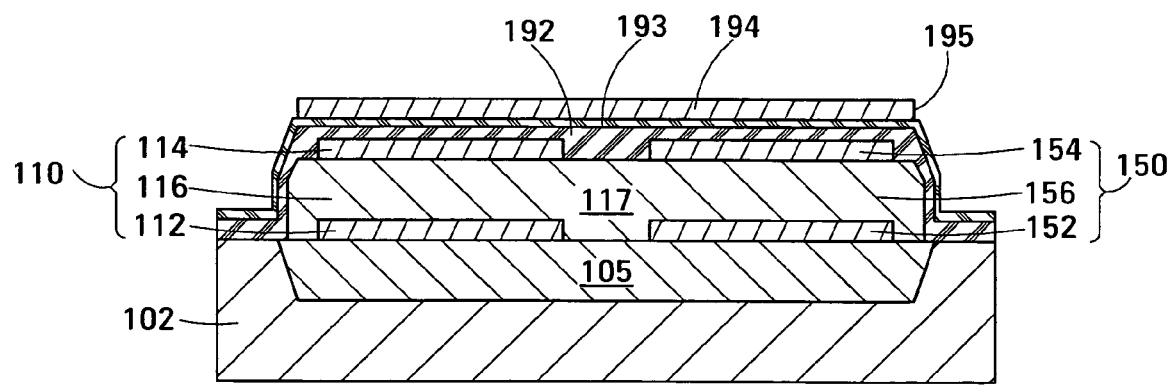
Figure 4G:
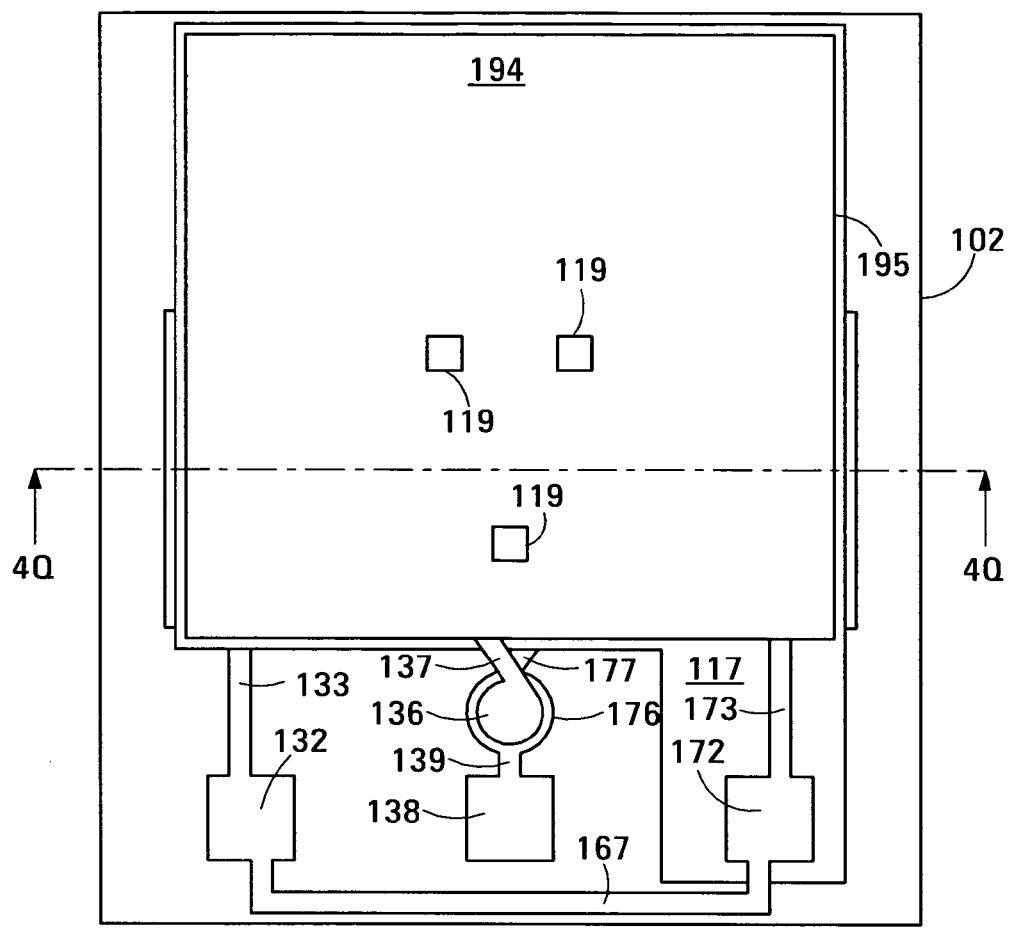
Figure 4Q:
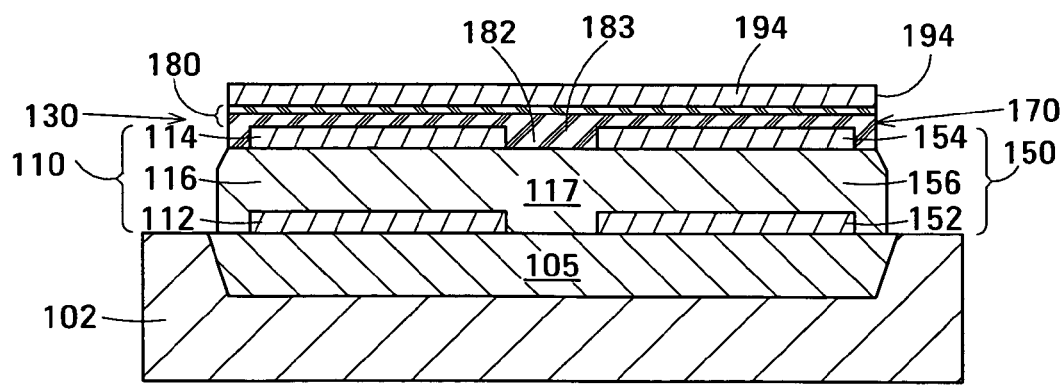
Figure 4H:
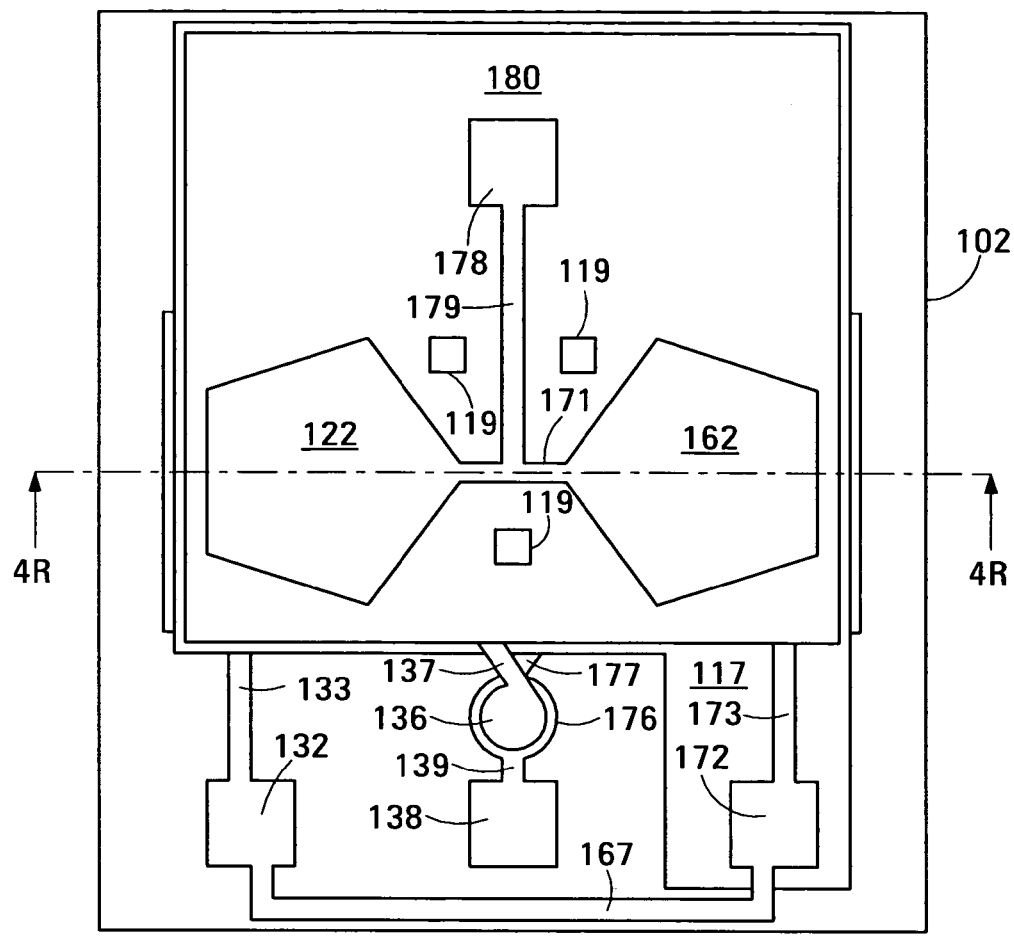

Third metal layer 194 is patterned as shown in FIGS. 4F and 4Q to define a hard mask 195 that will be used to define acoustic decoupler 180, composed of acoustic decoupling layer 182 and acoustic decoupling layer 183, in layers 192 and 193, respectively, of the first and second acoustic decoupling materials. Acoustic decoupler 180 provides acoustic decoupler 130 and acoustic decoupler 170. Hard mask 195 defines the extent of acoustic decoupler 180 and the location and extent of windows 119 in the acoustic decoupler. Third metal layer 194 may alternatively patterned so that hard mask 195 defines independent acoustic decouplers 130 and 170 instead of acoustic decoupler 180.

Layers 192 and 193 of the first and second acoustic decoupling materials are then patterned to define acoustic decoupler 180 with a shape defined by hard mask 195. Acoustic decoupler 180 provides acoustic decoupler 130 and acoustic decoupler 170. Layers 192 and 193 are patterned so that acoustic decoupler 180 covers at least electrode 114 and electrode 154, and exposes part of the surface of fill material 105, terminal pads 132, 138 and 172, and interconnection pads 136 and 176. Layers 192 and 193 are additionally patterned to define windows 119 that provide access to additional parts of the surface of the fill material. Layers 192 and 193 may alternatively be patterned to define independent acoustic decouplers 130 170 instead of acoustic decoupler 180.

Figure 4R:
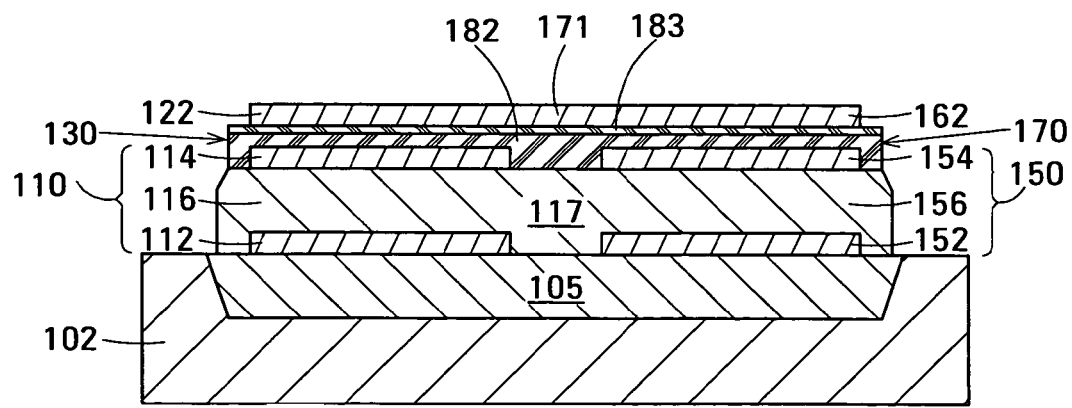

Third metal layer 194 is then re-patterned as shown in FIGS. 4G and 4R to define electrode 122, electrode 162 and terminal pad 178. The re-patterning also defines in the third metal layer electrical trace 171 extending between electrode 122 and electrode 162, and electrical trace 179 extending between electrical trace 171 and terminal pad 178.

Figure 4I:
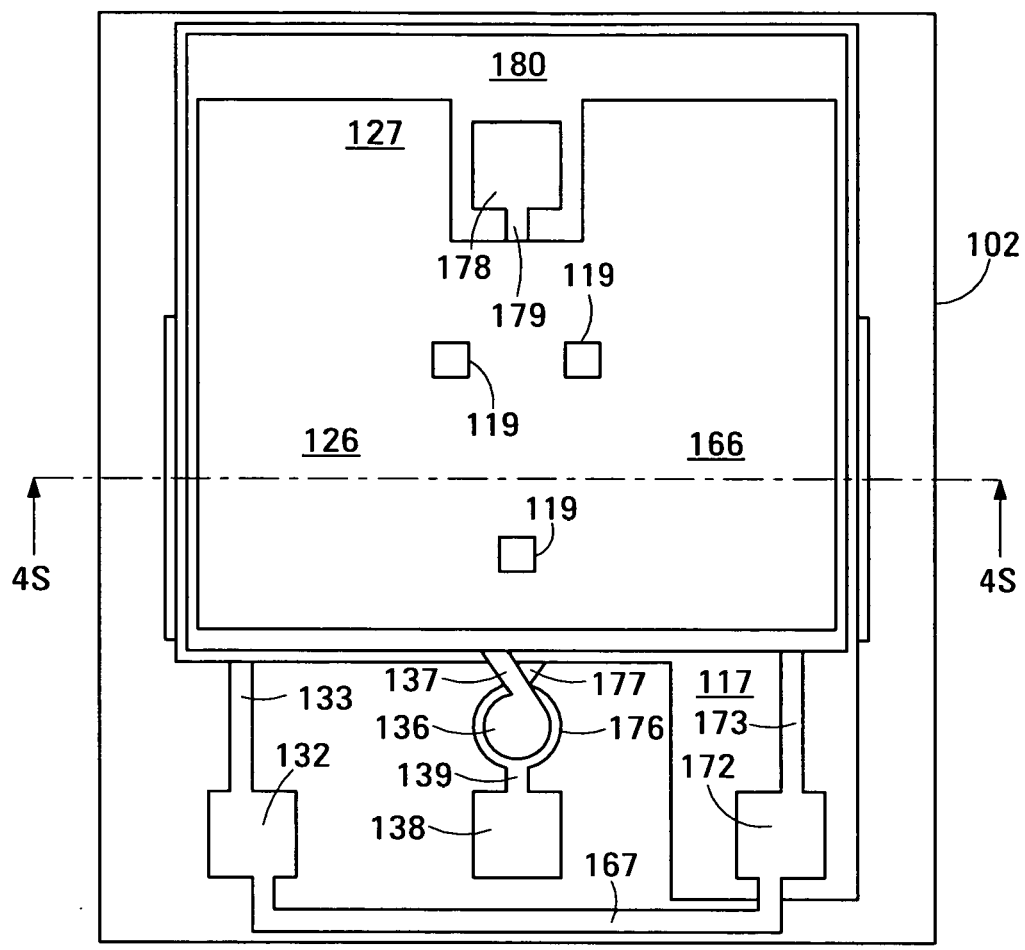
Figure 4S:
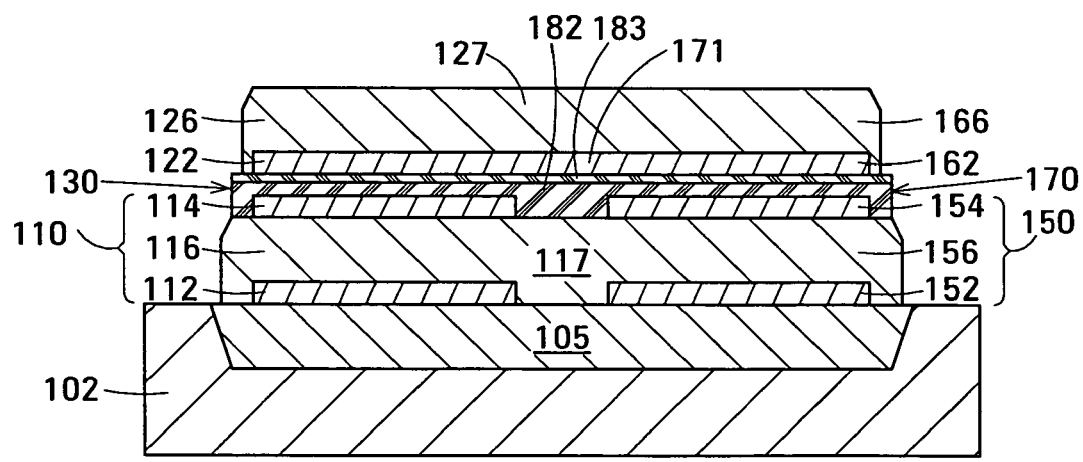

A layer of piezoelectric material is deposited and is patterned as shown in FIGS. 4I and 4S to define piezoelectric layer 127 that provides piezoelectric element 126 of FBAR 120 and piezoelectric element 166 of FBAR 150. Piezoelectric layer 127 is patterned to expose terminal pads 132, 138, 178 and 172, interconnection pads 136 and 176 and part of the surface of fill material 105. Piezoelectric layer 127 is additionally patterned to define the windows 119 that provide access to additional parts of the surface of the fill material.

Figure 4J:
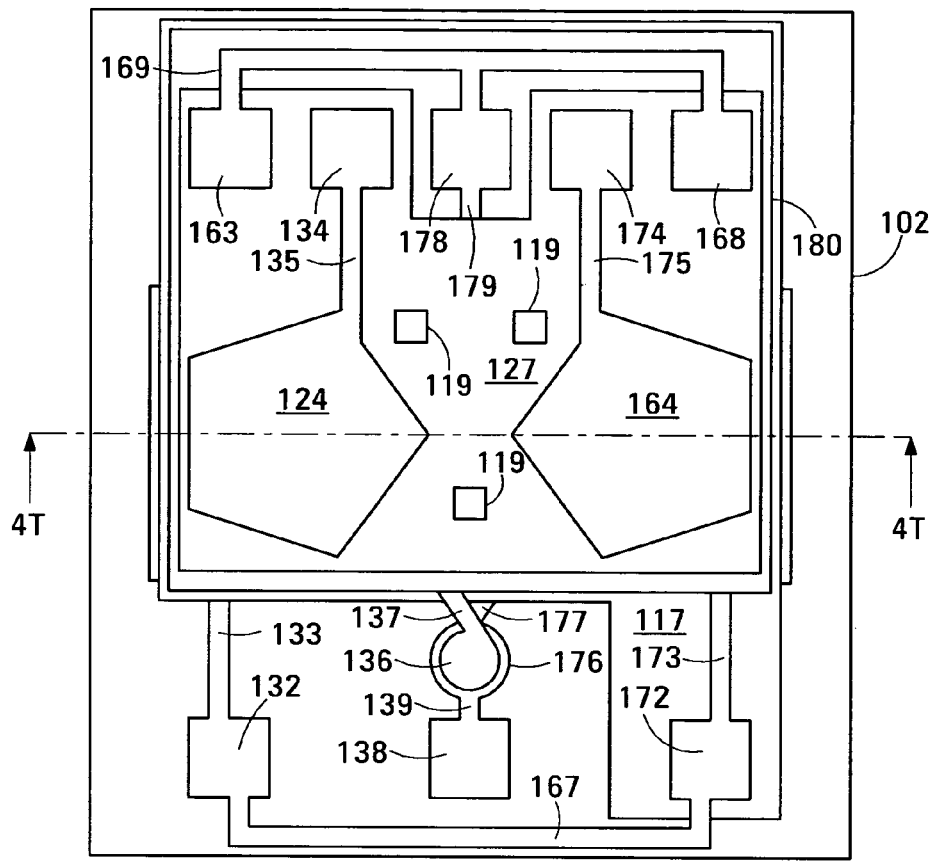
Figure 4T:
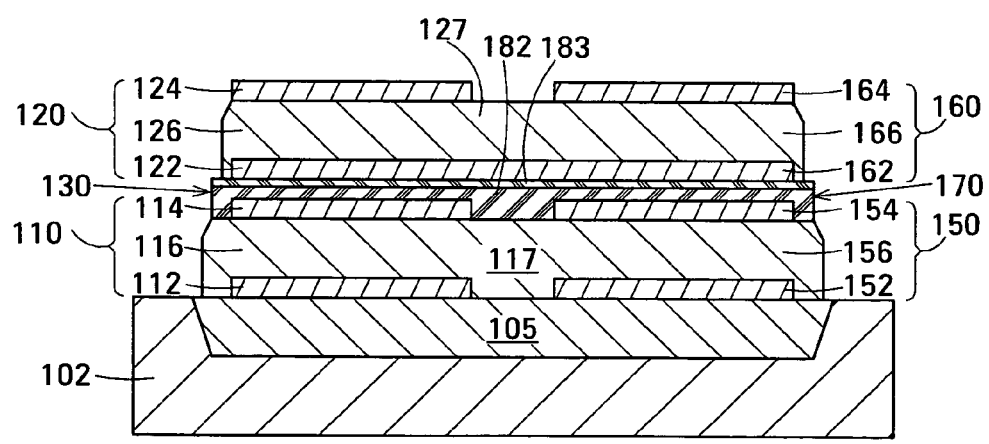

A fourth metal layer is deposited and is patterned as shown in FIGS. 4J and 4T to define electrode 124, electrode 164, terminal pad 163, terminal pad 134, terminal pad 174 and terminal pad 168. The patterning also defines in the fourth metal layer electrical trace 135 extending from electrode 124 to terminal pad 134, electrical trace 175 extending from electrode 164 to terminal pad 174, and electrical trace 169 extending from terminal pad 163 and terminal pad 168 to terminal pad 178.

The wafer is then isotropically wet etched to remove fill material 105 from cavity 104. As noted above, portions of the surface of fill material 105 remain exposed through, for example, windows 119. The etch process leaves film acoustically-coupled FACT 200 suspended over cavity 104, as shown in FIGS. 3A–3C.

In an embodiment, the etchant used to remove fill material 105 was dilute hydrofluoric acid.

A gold protective layer is deposited on the exposed surfaces of terminal pads 172, 138, 132, 163, 134, 178, 174 and 168.

The wafer is then divided into individual FACTs, including FACT 200. Each FACT is then mounted in a package and electrical connections are made between terminal pads 172, 132, 163, 134, 178, 174 and 168 of the FACT and pads or other connections that are part of the package.

This disclosure describes the invention in detail using illustrative embodiments. However, the invention defined by the appended claims is not limited to the precise embodiments described.

We claim:

1. A decoupled stacked bulk acoustic resonator (DSBAR) device, comprising:
   a lower film bulk acoustic resonator (FBAR) and an upper FBAR stacked on the lower FBAR, each FBAR comprising opposed planar electrodes and a piezoelectric element between the electrodes; and
   an acoustic decoupler between the FBARs, the acoustic decoupler comprising a first acoustic decoupling layer of a first acoustic decoupling material and a second acoustic decoupling layer of a second acoustic decoupling material, the first acoustic decoupling material having an acoustic impedance different from the second acoustic decoupling material, wherein one of the first acoustic decoupling material and the second acoustic decoupling material have an acoustic impedance of about 2 Mrayl, in which the DSBAR device is characterized by a center frequency and the acoustic impedances and thicknesses of the acoustic decoupling layers are chosen to cause the acoustic decoupler to impose a nominal phase change of an odd integral multiple of $\pi/2$ on an acoustic signal equal in frequency to the center frequency.

2. The DSBAR device of claim 1, in which one of the acoustic decoupling materials comprises a crosslinked polyphenylene polymer.

3. The DSBAR device of claim 1, in which the odd integral multiple is unity.

4. The DSBAR device of claim 1, wherein the acoustic impedance of the acoustic decoupler is intermediate between a first acoustic impedance associated with the first acoustic decoupling material and a second acoustic impedance associated with the second acoustic decoupling material.

5. The DSBAR device of claim 1, in which:
the first and second acoustic decoupling layers have respective thicknesses; and
the acoustic impedance of the acoustic decoupler is determined by the thicknesses of the acoustic decoupling layers.

6. The DSBAR device of claim 1, in which:
one of the acoustic decoupling materials comprises polyimide; and
another of the acoustic decoupling materials comprises a crosslinked polyphenylene polymer.

7. The DSBAR device of claim 6, in which the crosslinked polyphenylene polymer is prepared from a precursor solution having oligomers that polymerize.

8. The DSBAR device of claim 1, in which one of the acoustic decoupling materials comprises polyimide.

9. The DSBAR device of claim 1, in which one of the acoustic decoupling materials comprises a crosslinked polyphenylene polymer.

10. The DSBAR device of claim 1, in which one of the acoustic decoupling materials comprises poly(para-xylylene).

11. The DSBAR device of claim 1, additionally comprising:
an additional lower FBAR and an additional upper FBAR stacked on the additional lower FBAR, each additional FBAR comprising opposed planar electrodes and a piezoelectric element between the electrodes;
an additional acoustic decoupler between the additional FBARs, the additional acoustic decoupler comprising acoustic decoupling layers of acoustic decoupling materials having different acoustic impedances;
a first electrical circuit interconnecting the lower FBARs; and
a second electrical circuit interconnecting the upper FBARs.

* * * * *